(12) United States Patent
Martinez-Limia et al.

(10) Patent No.: US 12,159,900 B2
(45) Date of Patent: Dec. 3, 2024

(54) POWER TRANSISTOR CELL AND POWER TRANSISTOR HAVING FIELD SHIELDING CONTACTING AREAS CONNECTING FIELD SHIELDING AREAS TO METAL AREAS

(71) Applicant: Robert Bosch GmbH, Stuttgart (DE)

(72) Inventors: Alberto Martinez-Limia, Tuebingen (DE); Jan-Hendrik Alsmeier, Pfullingen (DE); Klaus Heyers, Reutlingen (DE); Stephan Schwaiger, Bodelshausen (DE); Wolfgang Feiler, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 452 days.

(21) Appl. No.: 17/595,798

(22) PCT Filed: May 18, 2020

(86) PCT No.: PCT/EP2020/063821
§ 371 (c)(1),
(2) Date: Jan. 11, 2022

(87) PCT Pub. No.: WO2020/239501
PCT Pub. Date: Dec. 3, 2020

(65) Prior Publication Data
US 2022/0320286 A1    Oct. 6, 2022

(30) Foreign Application Priority Data

May 31, 2019  (DE) ..................... 10 2019 208 010.3
Jul. 19, 2019  (DE) ..................... 10 2019 210 681.1

(51) Int. Cl.
*H01L 29/06*    (2006.01)
*H01L 29/10*    (2006.01)
(Continued)

(52) U.S. Cl.
CPC ...... *H01L 29/0696* (2013.01); *H01L 29/0634* (2013.01); *H01L 29/1095* (2013.01);
(Continued)

(58) Field of Classification Search
CPC ............. H01L 29/0696; H01L 29/0634; H01L 29/1095; H01L 29/1608; H01L 29/7813;
(Continued)

(56) References Cited

U.S. PATENT DOCUMENTS 5,378,911 A * 1/1995 Murakami ............ H01L 29/739
257/334
5,457,329 A * 10/1995 Harada ................. H01L 29/749
257/153
(Continued)

FOREIGN PATENT DOCUMENTS

DE    19629088 A1    1/1997
JP    2007005657 A    1/2007
(Continued)

OTHER PUBLICATIONS

International Search Report for PCT/EP2020/063821 Issued Sep. 9, 2020.

*Primary Examiner* — Ida M Soward
(74) *Attorney, Agent, or Firm* — NORTON ROSE FULBRIGHT US LLP; Gerard A. Messina

(57) ABSTRACT

A power transistor cell including a layer arrangement, which includes a front side and a rear side, the front side being situated opposite the rear side. A trench extends starting from, and perpendicular to, the front side along a first direction into the layer arrangement. The trench extends at least into a current-spreading layer, and expands along a second direction, which is situated perpendicularly to the first direction. Field shielding areas are situated at least partially in the current-spreading layer, wherein source areas (Continued)

and field shielding contacting areas are situated alternatingly along the second direction. One portion each of the body areas is situated between each source area and each field shielding contacting area. The field shielding contacting areas connect the field shielding areas to first metal areas on the front side. The field shielding contacting areas make contact at least partially with side faces of the trench.

10 Claims, 21 Drawing Sheets

(51) Int. Cl.
*H01L 29/16* (2006.01)
*H01L 29/423* (2006.01)
*H01L 29/78* (2006.01)

(52) U.S. Cl.
CPC ...... *H01L 29/1608* (2013.01); *H01L 29/0692* (2013.01); *H01L 29/4236* (2013.01); *H01L 29/7801* (2013.01); *H01L 29/7802* (2013.01)

(58) Field of Classification Search
CPC ............ H01L 29/0623; H01L 29/0878; H01L 29/2003; H01L 29/7801; H01L 29/7802; H01L 29/4236; H01L 29/0692
See application file for complete search history.

(56) References Cited

U.S. PATENT DOCUMENTS

| | | | |
|---|---|---|---|
| 6,359,306 B1* | 3/2002 | Ninomiya | H01L 29/7824 257/E29.066 |
| 6,774,408 B2* | 8/2004 | Ninomiya | H01L 21/823487 257/E29.066 |
| 7,700,971 B2 | 4/2010 | Ueno | |
| 7,700,998 B2* | 4/2010 | Okumura | H01L 29/7397 438/270 |
| 8,637,368 B2* | 1/2014 | Bhalla | H01L 29/66734 438/270 |
| 8,785,278 B2* | 7/2014 | Yilmaz | H01L 29/7813 257/334 |
| 9,306,061 B2 | 4/2016 | Cheng et al. | |
| 10,453,957 B2* | 10/2019 | Kobayashi | H01L 29/7827 |
| 2006/0289930 A1 | 12/2006 | Arai | |
| 2009/0200559 A1* | 8/2009 | Suzuki | H01L 29/1095 257/77 |
| 2009/0280609 A1* | 11/2009 | Akiba | H01L 29/0634 438/270 |
| 2011/0291110 A1* | 12/2011 | Suzuki | H01L 29/0878 257/77 |
| 2017/0365665 A1* | 12/2017 | Hoshi | H01L 29/12 |
| 2018/0138274 A1 | 5/2018 | Ohse et al. | |
| 2018/0240876 A1 | 8/2018 | Tu et al. | |
| 2018/0366569 A1 | 12/2018 | Zeng et al. | |
| 2019/0081161 A1* | 3/2019 | Takahashi | H01L 29/0692 |

FOREIGN PATENT DOCUMENTS

| | | | | |
|---|---|---|---|---|
| JP | 2012069797 A | 4/2012 | | |
| JP | 2019016775 A | 1/2019 | | |
| WO | WO-2019009091 A1 * | 1/2019 | ............ | H01L 29/06 |
| WO | WO-2019054517 A1 * | 3/2019 | ........ | H01L 29/0619 |

\* cited by examiner

POWER TRANSISTOR CELL AND POWER TRANSISTOR HAVING FIELD SHIELDING CONTACTING AREAS CONNECTING FIELD SHIELDING AREAS TO METAL AREAS

FIELD

The present invention relates to a power transistor cell and to a power transistor.

BACKGROUND INFORMATION

Silicon carbide transistors are used for applications in which a high blocking resistance and a low forward resistance are simultaneously required. In this case, the electric fields occurring during high block voltage are significantly greater in contrast to power transistors made of semiconductor materials including narrow band gaps, so that measures are required for protecting the gate oxide from high field strengths.

U.S. Pat. No. 7,700,971 B2 describes p-doped regions situated in the drift region, which are situated at regular intervals in a horizontal direction and are below a trench MOSFET structure, the p-doped regions being connected to the source potential via a contact structure. The source areas of the component in this case are situated laterally next to the trenches, whereas the contact structures are implemented after the etching of the SiC material by metallization of the surface of an exposed portion of the embedded p-regions situated outside the gate-trench structure areas.

In the reverse operation of the component, current conduction over longer sections of the embedded p-regions up to the outer contact structures is disadvantageous, since it causes relatively high power losses and requires slower switching frequencies during operation.

U.S. Pat. No. 9,306,061 A describes a p-doped region situated in the drift region, which is connected via a contacting area to the source potential. The source areas and the contacting areas in this case are situated laterally next to the trenches, the contacting areas crossing or penetrating the source areas. The source regions in this case are connected laterally directly to the trenches. The contacting areas are spaced laterally apart from the trenches and make contact with the source regions. The sequence of the source regions and the contacting areas remains unchanged along the longitudinal expansion of the trenches. This means, the source regions and contacting areas alternate transversely to the longitudinal expansion of the trenches, the source regions always making contact with the trenches and the contacting areas never making contact with the trenches.

A disadvantage of this is that the lateral dimensions of the power transistor transverse to the longitudinal expansion of the trenches are large.

An object of the present invention is to overcome these disadvantages.

SUMMARY

In accordance with an example embodiment of the present invention, a power transistor cell includes a layer arrangement, which includes a front side and a rear side. The front side in this case is situated opposite the rear side. Starting from the front side, a trench extends along a first direction into the layer arrangement and extends at least into a current-spreading layer. The trench expands along a second direction, which is situated perpendicularly to the first direction. Field shielding areas are situated at least partially in the current-spreading layer. According to the present invention, source areas and field shielding contacting areas are situated alternatingly along the second direction, one portion or strip of the body area each being situated between each source area and each field shielding contacting area. The field shielding contacting areas connect the field shielding areas to first metal areas on the front side, the field shielding contacting areas making contact at least partially with side faces of the trench. In other words, the source areas and the field shielding contacting areas are situated alternatingly in the expansion direction of the trench, the source areas and the field shielding contacting areas indirectly succeeding one another. This means, they are each separated from one another by a portion or strip of the body area. Thus, the source areas, body areas and field shielding contacting areas are connected alternatingly at least partially to the side faces of the trench in the longitudinal profile of the trench. The source areas in this case extend from one trench to the next trench at least partially uninterrupted along a third direction, which is situated perpendicularly to the first direction and to the second direction.

An advantage of this is that the dimensions of the power transistor cell are small. This means, the pitch of the power transistor cell is reduced in contrast to conventional trench power transistor cells, as a result of which the forward resistance is reduced.

In one refinement of the present invention, the field shielding areas are situated within the current-spreading layer and spaced apart from a drift layer.

An advantage of this is that a high vertical and lateral current conduction with low on-resistance is possible.

In one further embodiment of the present invention, the field shielding areas are spaced further apart from the front side than a bottom of the trench. In other words, they are situated deeper than the trench bottom as viewed from the front side.

An advantage of this is that the trench is protected from high electric field strengths.

In one further embodiment of the present invention, the current-spreading layer is bell-shaped laterally to the field shielding areas.

An advantage of this is that the current flow is not hindered by the field shielding areas, since the field shielding areas are spaced laterally apart from the trench.

In one refinement of the present invention, the current-spreading layer has a rectangular shape laterally to the field shielding areas.

An advantage of this is that the surface area of the current conducting areas is maximized.

In one further embodiment of the present invention, body contacting areas are situated within the body areas partially below the source areas, the body contacting areas being connected via the field shielding contacting areas to the first metal areas of the front side of the layer arrangement.

An advantage of this is that the body contact is improved. This means that the behavior of the fly-back diode is improved.

In one refinement of the present invention, the field shielding areas are rounded in the direction of the trench and/or of the rear side.

An advantage of this is that the electric field strength is reduced.

In one further embodiment of the present invention, the layer arrangement includes a semiconductor substrate that includes a wide band gap.

An advantage of this is that the resulting component has a higher breakdown voltage, fewer losses, higher operating temperatures and higher switching frequencies.

In one refinement of the present invention, the semiconductor substrate includes silicon carbide or gallium nitride.

The power transistor according to an example embodiment of the present invention includes a plurality of power transistor cells, which include a layer arrangement having a front side and a rear side. The front side in this case is situated opposite the rear side. Starting from the front side, a trench extends along a first direction into the layer arrangement and extends at least into a current-spreading layer. The trench expands along a second direction, which is situated perpendicularly to the first direction. Field shielding areas are situated at least in areas in the current-spreading layer. According to the present invention, source areas and field shielding contacting areas are situated alternatingly along the second direction, one portion or strip each of the body area being situated between each source area and each field shielding contacting area. The field shielding contacting areas connect the field shielding areas to first metal areas on the front side, the field shielding contacting areas making contact at least partially with side faces of the trench.

An advantage of this is that the power transistor has a small pitch dimension, as a result of which the forward resistance is reduced.

Further advantages of the present invention result from the following description of exemplary embodiments and from the figures.

BRIEF DESCRIPTION OF THE DRAWINGS

The present invention is explained below with reference to preferred specific embodiments and to the figures.

DETAILED DESCRIPTION OF EXAMPLE EMBODIMENTS

Figure 1A:
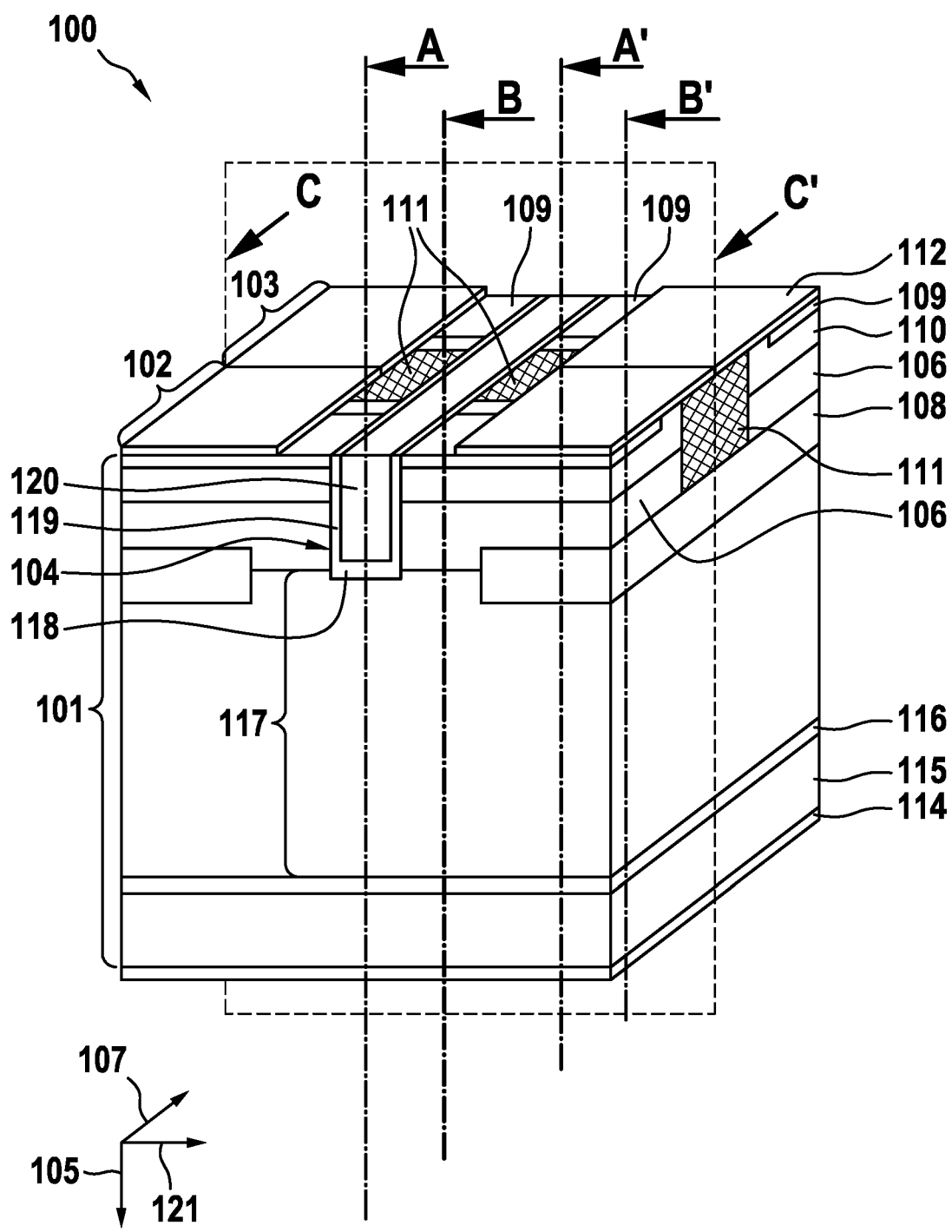
FIG. 1A shows a top view of a power transistor cell, in accordance with an example embodiment of the present invention.

FIG. 1A shows a top view of a power transistor cell 100. Power transistor cell 100 includes a front power transistor half-cell 102 and a rear power transistor half-cell 103, which are situated successively along a second direction 107. Front power transistor half-cell 102 and rear power transistor half-cell 103 in this case are identically structured, the two being situated along second direction 107 mirror-inverted to one another. This means, the contacting surfaces of front power transistor half-cell 102 and rear power transistor half-cell 103 are identical. Power transistor cell 100 includes a layer arrangement 101. Layer arrangement 101 includes a semiconductor substrate 115, a buffer layer 116, a drift layer 117, a current-spreading layer 106, field shielding areas 108, source areas 109, body areas 110 and field shielding contacting areas 111. In this arrangement, buffer layer 116 is situated on semiconductor substrate 115. Drift layer 117 is situated on buffer layer 116. Current-spreading layer 106 is situated on drift layer 117. Source areas 109 and body areas 110 are situated partially on current-spreading layer 106. First metal areas 112 for contacting source areas 109 and body areas 110 are situated on the front side of layer arrangement 101. During contacting, ohmic contacts form between first metal areas 112 and source areas 109 and between first metal areas 112 and body areas 110. Field shielding areas 108 are situated at least partially in current-spreading layer 106. In this case, they are electrically connected via field shielding contacting areas 111 to first metal areas 112. A second metal area 114 is situated below semiconductor substrate 115. It functions as a drain metallization. An ohmic contact forms between semiconductor substrate 115 and second metal area 114. A trench 104 extends starting from the front side, which extends in a first direction 105 at least into current-spreading layer 106. Trench 104 expands in second direction 107, which is situated perpendicularly to first direction 105. Second direction 107 corresponds in this case to the expansion direction or longitudinal direction of trench 104. The bottom of trench 104 includes a field oxide 118 and a gate oxide 119 at the side walls. Field oxide 118 in this case may have a larger layer thickness than gate oxide 119. Trench 104 is filled with a highly doped n- or p-polysilicon. Source areas 109 and field shielding contacting areas 111 are situated alternatingly along the expansion direction of trench 104. One strip-like portion each of body area 110 is situated between each source area 109 and each field shielding contacting area 111. This means, one source area 109, one portion of body area 110, one field shielding contacting area 111, one portion of a further body area 110 and one further source area 109 are each situated along the trench length of a power transistor cell 100 in the upper area of the trench. Source areas 109 and body areas 110 in this case are directly adjacent to the side wall of trench 104. Field shielding contacting areas 111 are partially also directly adjacent to the side wall of trench 104 and make contact with the side wall of trench 104. In addition, current-spreading layer 106 and drift layer 117 are partially adjacent to the side walls of trench 104.

In one exemplary embodiment, surfaces of field shielding areas 108 as viewed from the front side of layer arrangement 101 are situated at a smaller distance to the front side than the bottom of trench 104. Field shielding areas 108 in this case extend from current-spreading layer 106 into drift layer 117.

Semiconductor substrate 115 is highly n-doped and buffer layer 116 is n-doped. Drift layer 117 and current-spreading layer 106 are n-doped, current spreading layer 106 having a higher doping concentration than drift layer 117. This results in a better current conduction below the channel area, and thus in a lower forward resistance. Source areas 109 are highly n-doped and body areas 110, field shielding areas 108 and field shielding contacting areas 111 are p-doped.

Semiconductor substrate 115 may include silicon, silicon carbide, gallium nitride or gallium oxide.

Field shielding contacting areas 111 are manufactured with the aid of ion implantations or epitaxy.

Figure 1B:
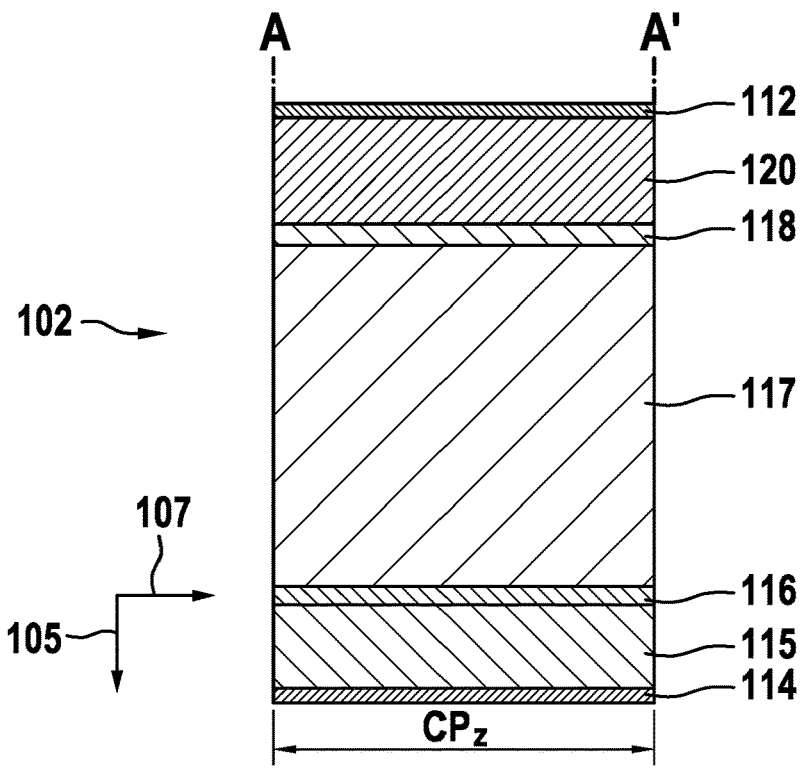
FIG. 1B shows a detail of a sectional view along a plane AA' of the power transistor cell.

FIG. 1B shows a detail of a sectional view along a plane AA' through power transistor cell 100. The detail in this case shows the section along plane AA' through front power transistor half-cell 102. Line AA' in this case is situated in parallel to the plane, which is spanned by first direction 105 and by second direction 107 and extends along third direction 121 through the middle of the trench. FIG. 1B shows second metal layer 114, semiconductor substrate 115, buffer layer 116, drift layer 117, field oxide 118, gate metallization 120 and first metal layer 112. The depth of front power transistor half-cell 102 along second direction 107 is identified by reference symbol CPz.

Figure 1C:
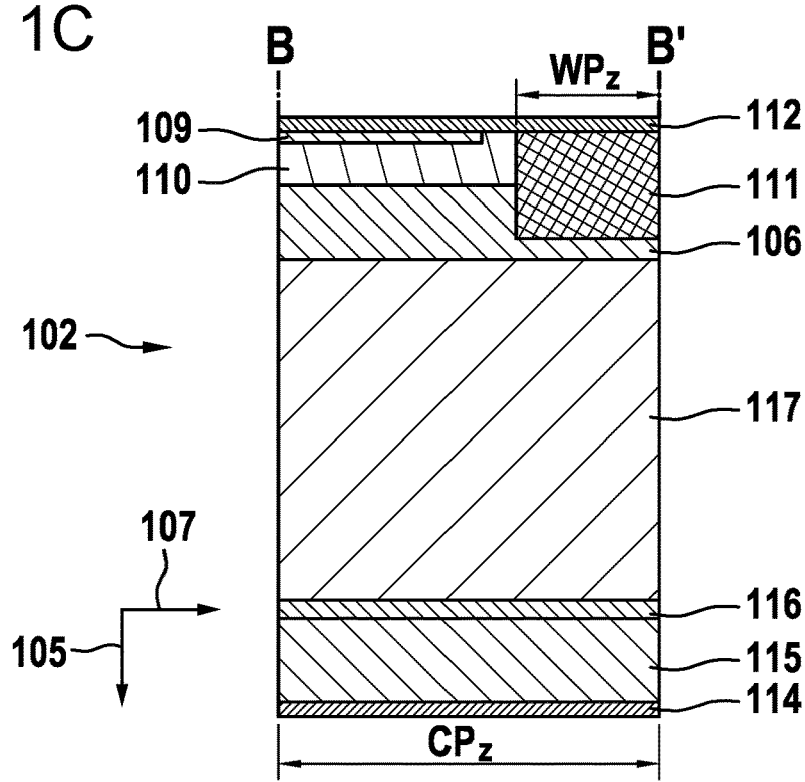
FIG. 1C shows a detail of a sectional view along a plane BB' of the power transistor cell.

FIG. 1C shows a detail of a sectional view along a plane BB' through power transistor cell 100. The detail in this case shows the section along plane BB' through front power transistor half-cell 102. Plane BB' in this case is situated in parallel to the plane that is spanned by first direction 105 and second direction 107, and extends along third direction 121 spaced laterally apart between trench 104 and first metal layer 112. FIG. 1C shows second metal layer 114, semiconductor substrate 115, buffer layer 116, drift layer 117, current-spreading layer 106, body areas 110, source areas 109, field shielding contacting areas 111 and first metal layer 112. The depth of field shielding contacting area 111 along second direction 107 is identified by reference symbol WPz and the depth of front power transistor half-cell 102 along second direction 107 is identified by reference symbol CPz.

Figure 1D:
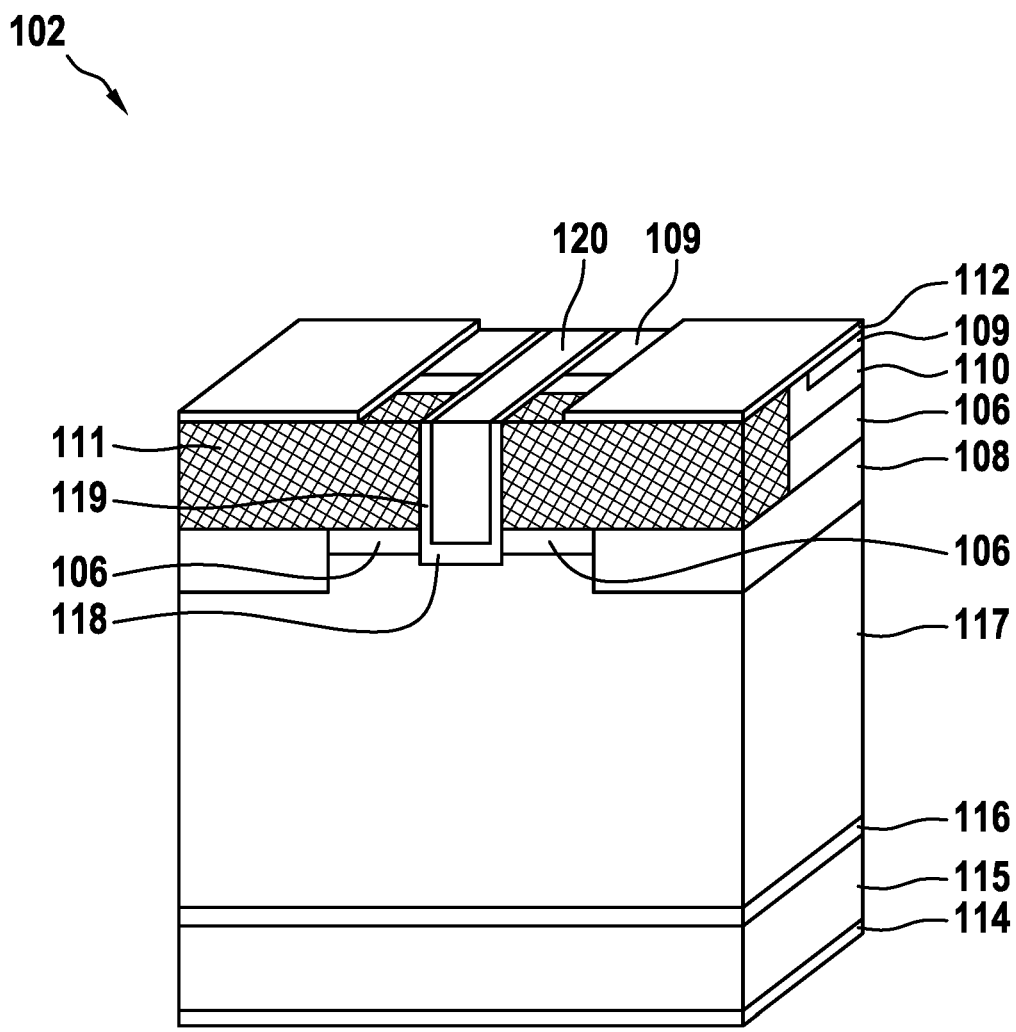
FIG. 1D shows a sectional view along plane CC' of the power transistor cell.
Figure 1D:
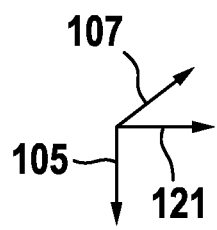

FIG. 1D shows a sectional view along plane CC' of power transistor cell 100. The section shows the rear view of front power transistor half-cell 102 of power transistor cell 100. The section through power transistor cell 100 in this case is parallel to the plane that is spanned by first direction 105 and third direction 121. In second direction 107, the section extends through the point of half the trench length. The reference numerals of FIG. 1D correspond to those of FIG. 1A and describe the same components. Field shielding contacting areas 111 and source areas 109 alternate along the expansion direction of trench 104. It is apparent that field shielding contacting areas 111 are neither adjacent to nor penetrate or cross source areas 109.

Figure 2A:
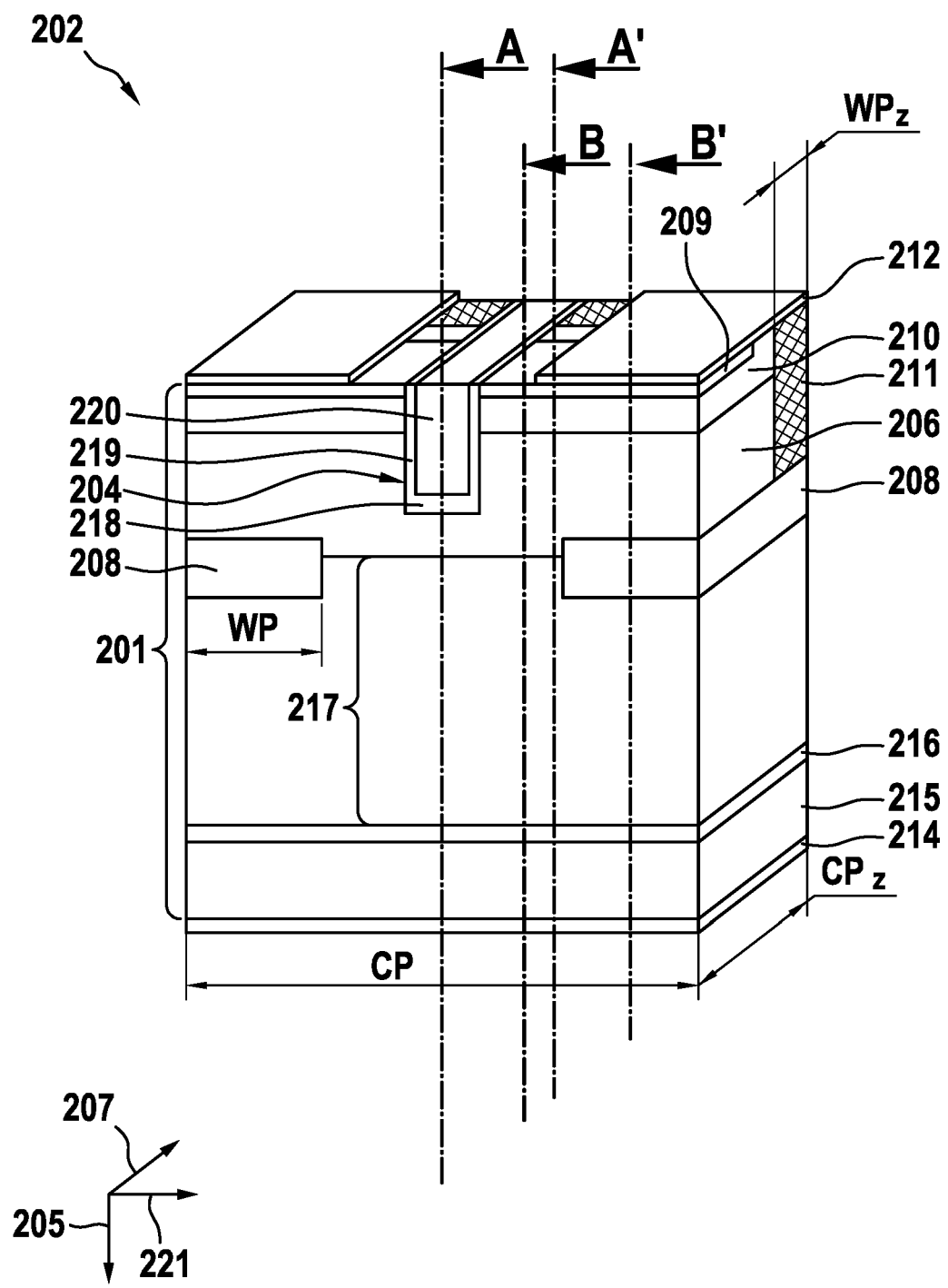
FIG. 2A shows a top view of a front power transistor half-cell, in accordance with an example embodiment of the present invention.

FIG. 2A shows a top view of a front power transistor half-cell 202. The two rear locations of the reference numerals of FIG. 2A which correspond to the identical rear reference numerals of FIG. 1A, describe the same components as in FIG. 1A. The difference compared to FIG. 1A is that field shielding areas 208 are spaced further apart from the front side of layer arrangement 201 than the trench bottom. In other words, field shielding areas 208 are situated deeper than the trench bottom as viewed from the front side. As a result, a field shielding is generated which has a field-reducing effect at the trench bottom.

Figure 2B:
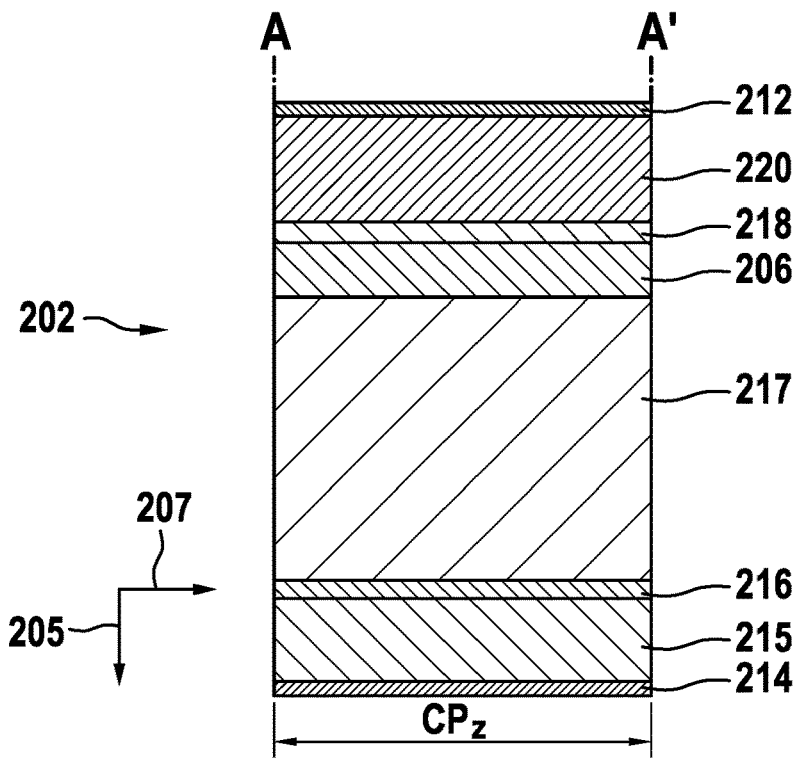
FIG. 2B shows a sectional view along plane AA' through the front power transistor half-cell.

FIG. 2B shows a sectional view along plane AA' through front power transistor half-cell 202 of power transistor cell 200. The two rear locations of the reference numerals of FIG. 2B, which correspond to the identical rear reference numerals of FIG. 1B, describe the same components as in FIG. 1B. The difference compared to FIG. 1B is that in FIG. 2B, current-spreading layer 206 is situated between drift layer 217 and field oxide 218. In other words, the trench is located completely in current-spreading layer 206.

Figure 2C:
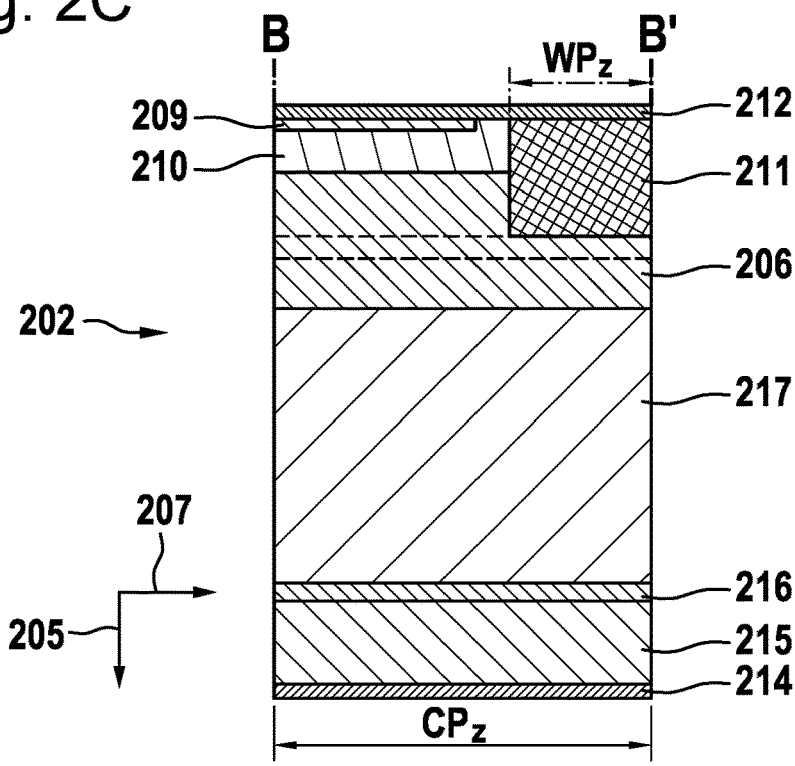
FIG. 2C shows a sectional view along plane BB' through the front power transistor half-cell.

FIG. 2C shows a sectional view along plane BB' through front power transistor half-cell 202 of power transistor cell 200. The two rear locations of the reference numerals of FIG. 2C, which correspond to the identical rear reference numerals of FIG. 1C, describe the same components as in FIG. 1C. The difference compared to FIG. 1C is that current-spreading layer 206 starting from the front side of the layer arrangement extends deeper into layer arrangement 201. This means, given the same overall height as in FIG. 1C, drift zone 217 exhibits a lower height than drift zone 117 in FIG. 1C.

Figure 2D:
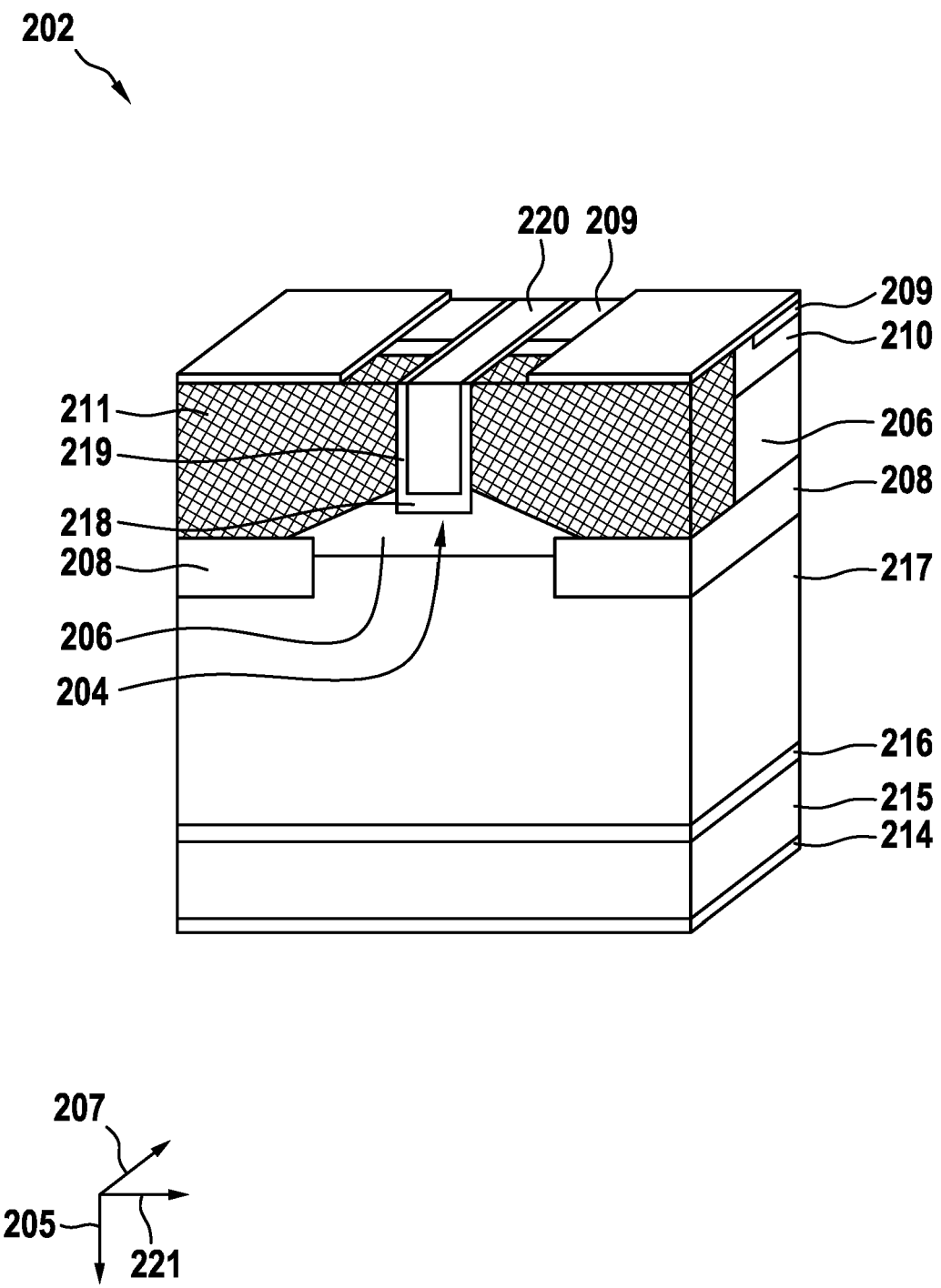
FIG. 2D shows a rear view of the front power transistor half-cell.

FIG. 2D shows the rear side of front power transistor half-cell 202. Field shielding contacting areas 211 have a gradient profile below trench 204. This means, they have an inhomogeneous depth in first direction 205 when following the profile of the boundary between field shielding contacting areas 211 and current-spreading layer 206 along third direction 221. Current-spreading layer 206 in this case is bell-shaped or arrow-shaped. Thus, current-spreading layer 206 becomes larger. This results in a better current conduction below the channel area in vertical or first direction 205, in lateral or second direction 207 and in third direction 221.

Figure 3A:
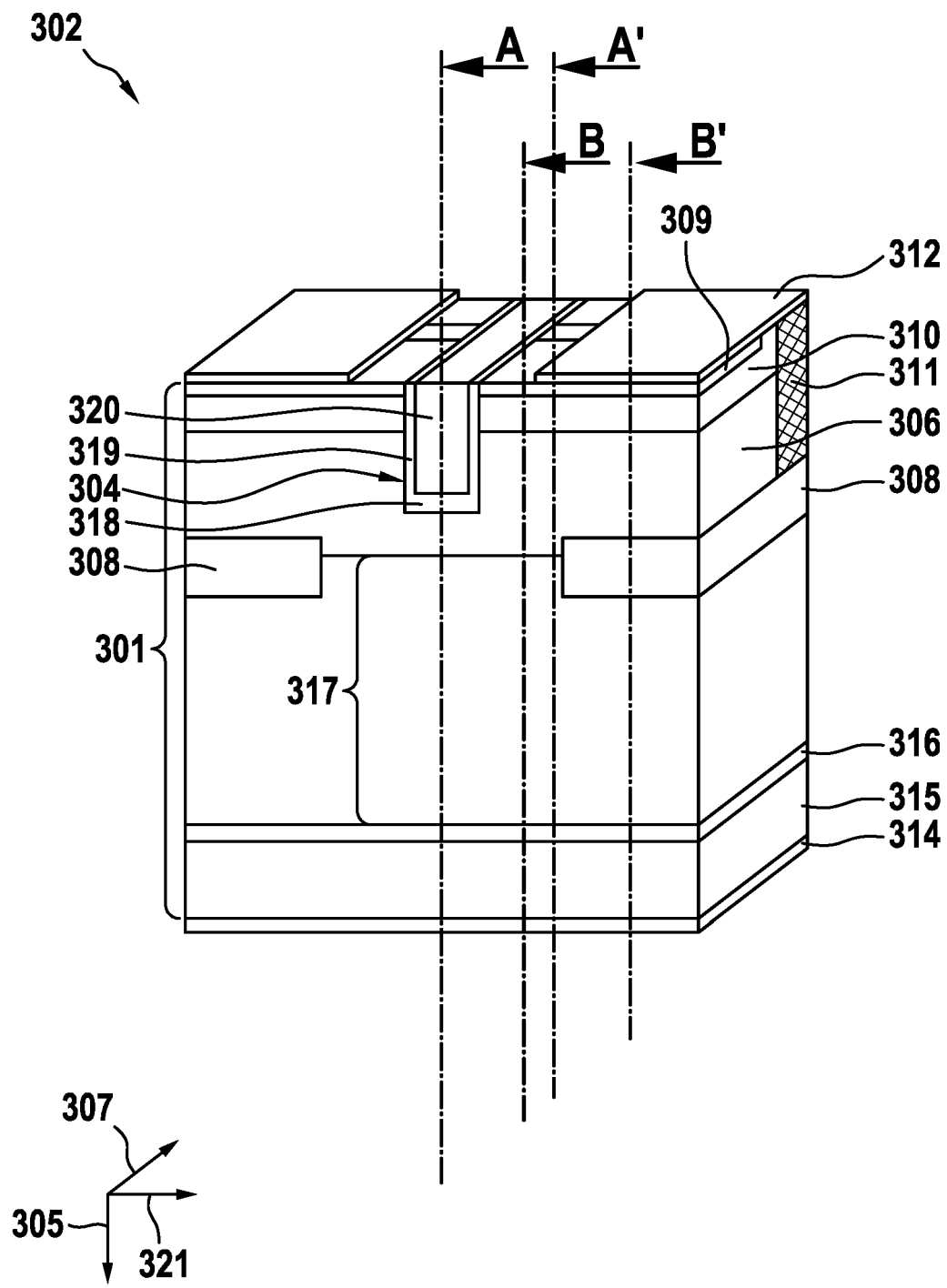
FIG. 3A shows a top view of a further front power transistor half-cell, in accordance with an example embodiment of the present invention.

FIG. 3A shows a top view of a further front transistor half-cell 302. The two rear locations of the reference numerals of FIG. 3A, which correspond to the identical rear reference numerals of FIG. 2A, describe the same components as in FIG. 2A. The top view of further front power transistor half-cell 302 of FIG. 3A does not differ from the top view of front power transistor half-cell 202 of FIG. 2A.

Figure 3B:
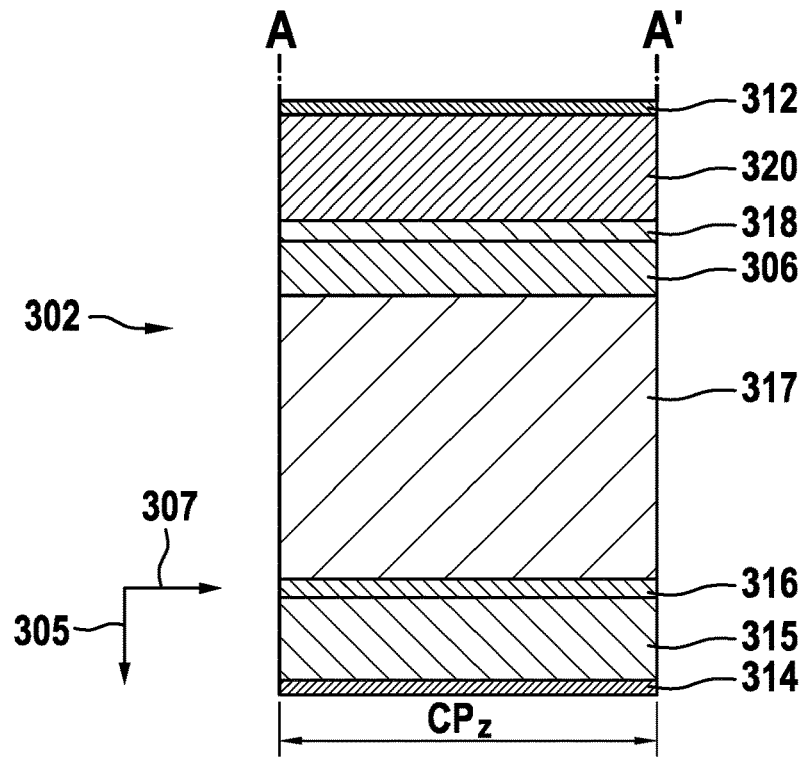
FIG. 3B shows a sectional view along plane AA' through the further front power transistor half-cell.

FIG. 3B shows a sectional view along plane AA' through further front power transistor half-cell 302. FIG. 3B in this case does not differ from FIG. 2B.

Figure 3C:
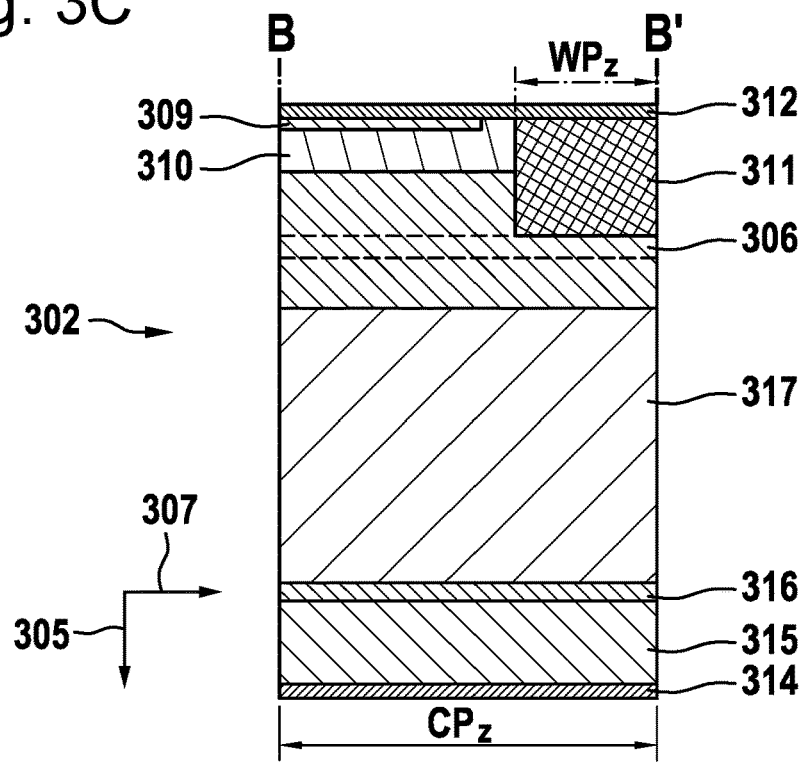
FIG. 3C shows a sectional view along plane BB' through the further front power transistor half-cell.

FIG. 3C shows a sectional view along plane BB' through further front power transistor half-cell 202. FIG. 3C does not differ from FIG. 2C.

Figure 3D:
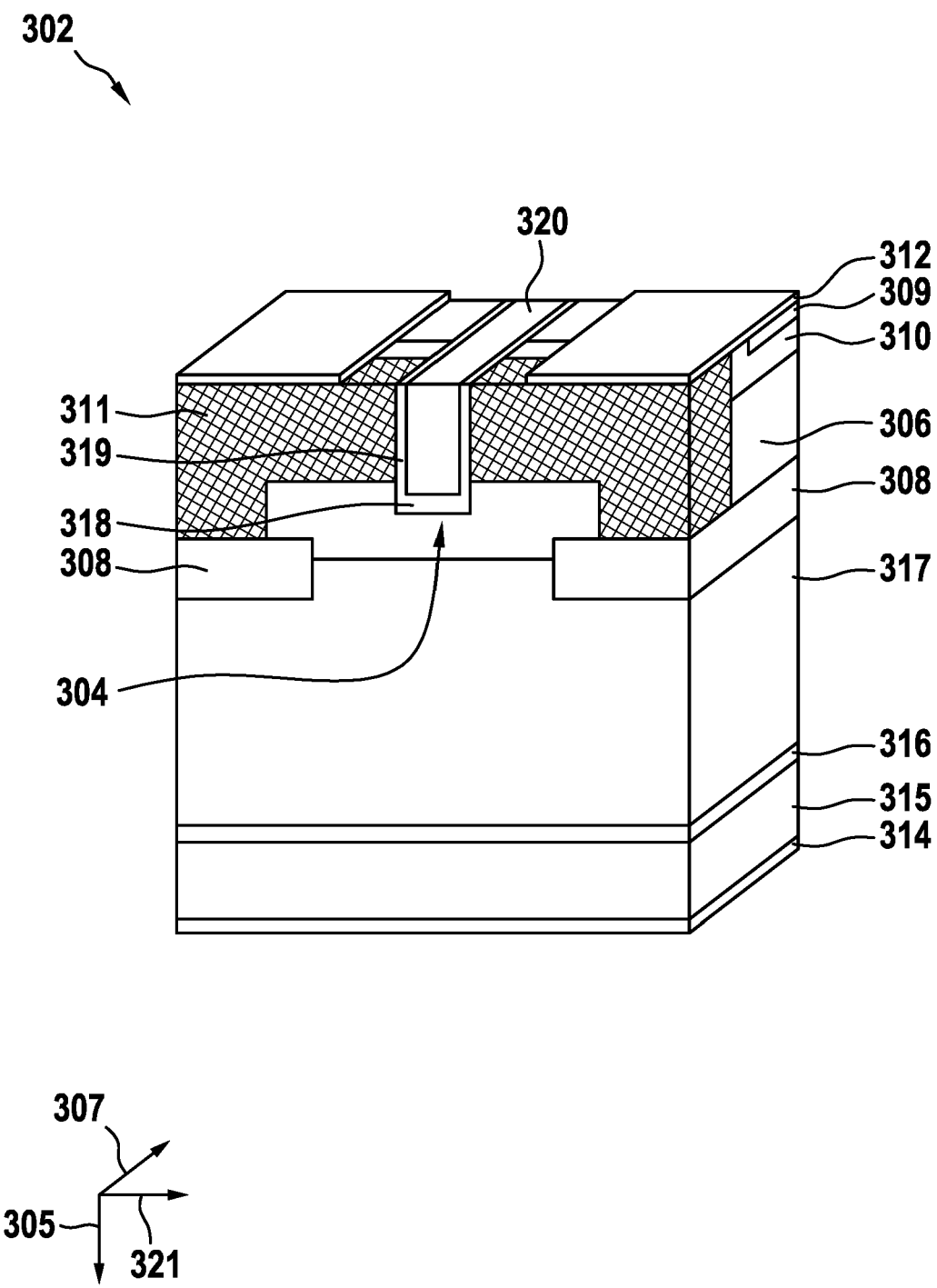
FIG. 3D shows a rear view of the further front power transistor half-cell.

FIG. 3D shows a rear view of further front power transistor half-cell 302. Current-spreading layer 306 has a rectangular shape. As a result, current-spreading layer 306 is uniformly or evenly expanded below trench 304. This results in an improved current conduction below trench 304 along second direction 307 and third direction 321.

Figure 4A:
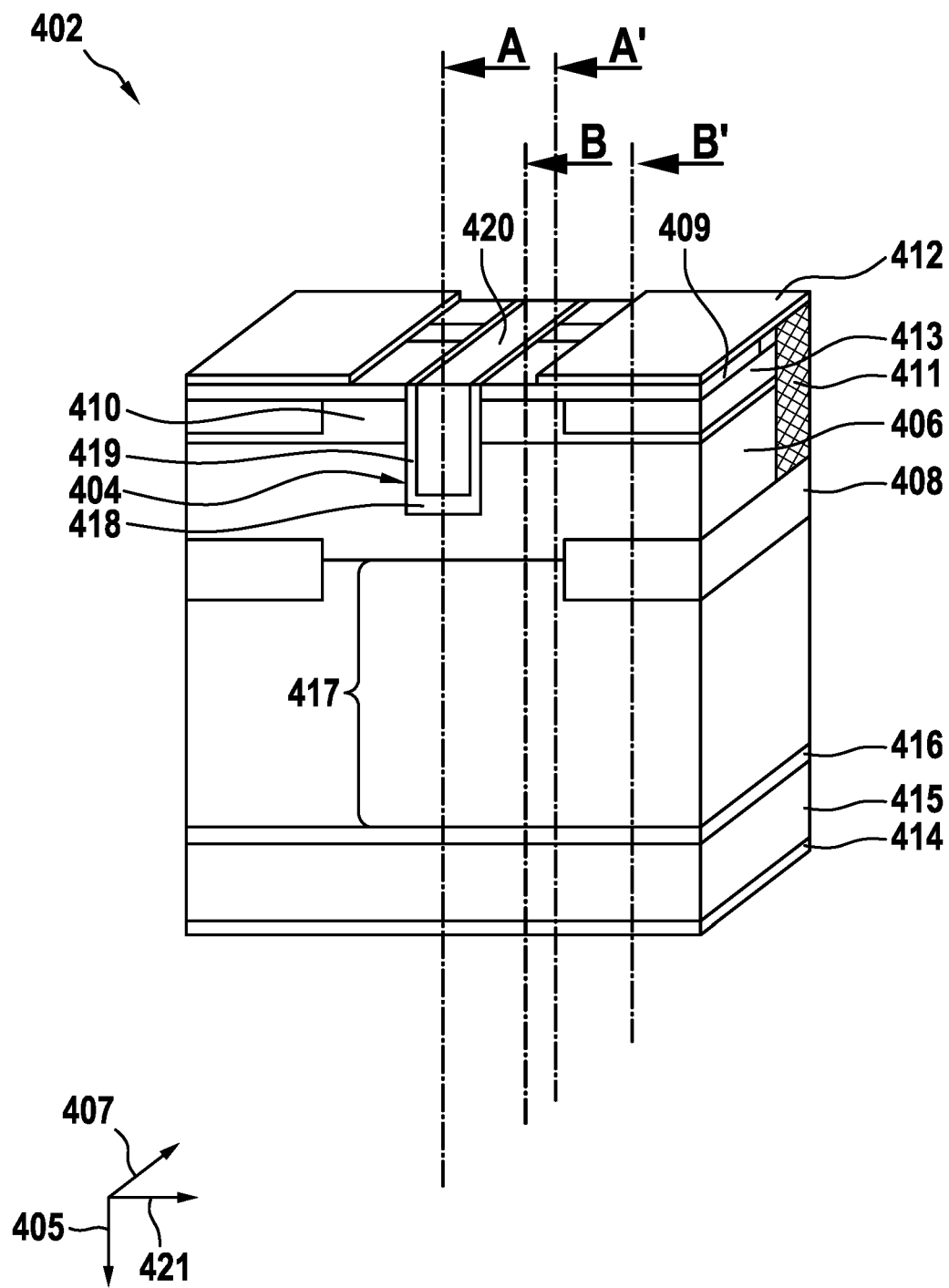
FIG. 4A shows a top view of a further front power transistor half-cell, in accordance with an example embodiment of the present invention.

FIG. 4A shows a top view of a further front power transistor cell 402. The two rear locations of the reference numerals of FIG. 4A, which correspond to the identical rear reference numerals of FIG. 2A, describe the same components as in FIG. 2A. The difference compared to FIG. 2A is that FIG. 4A also includes body contacting regions 413, which make contact with body areas 410. Body contacting regions 413 in this case are situated below source regions 409. Body contacting regions 413 are electrically connected to field shielding contacting areas 411. In the case of very steep drain voltage transients, body contacting regions 413 result in the power transistor cell becoming insensitive to an activation of the parasitic npn-transistor, which is formed from current-spreading layer 406, body areas 410 and source areas 409. Alternatively, body contacting regions 413 extend into current-spreading layer 406, i.e., they are situated partially outside body area 410.

Figure 4B:
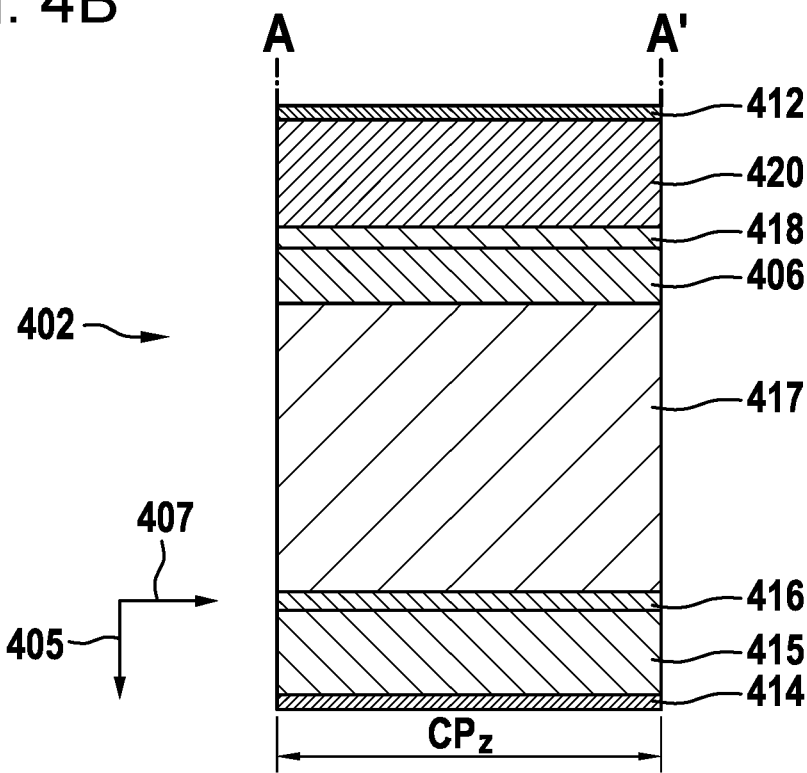
FIG. 4B shows a sectional view along plane AA' through the further front power transistor half-cell.

FIG. 4B shows a sectional view along plane AA' through further front power transistor half-cell 402. FIG. 4B in this case does not differ from FIG. 2B.

Figure 4C:
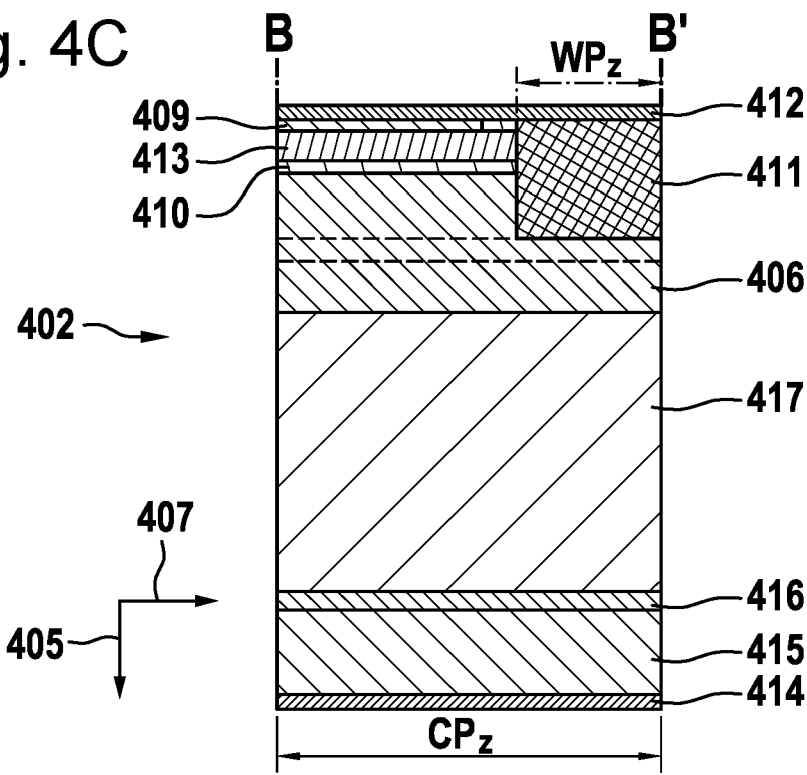
FIG. 4C shows a sectional view along plane BB' through the further front power transistor half-cell.

FIG. 4C shows a sectional view along plane BB' through further front power transistor half-cell 402. The two rear locations of the reference numerals of FIG. 4C, which correspond to the identical rear reference numerals of FIG. 2C, describe the same components as in FIG. 2C. The difference compared to FIG. 2C is that FIG. 4C also includes body contacting regions 413, which make contact with body areas 410. Body contacting regions 413 are flat.

Figure 4D:
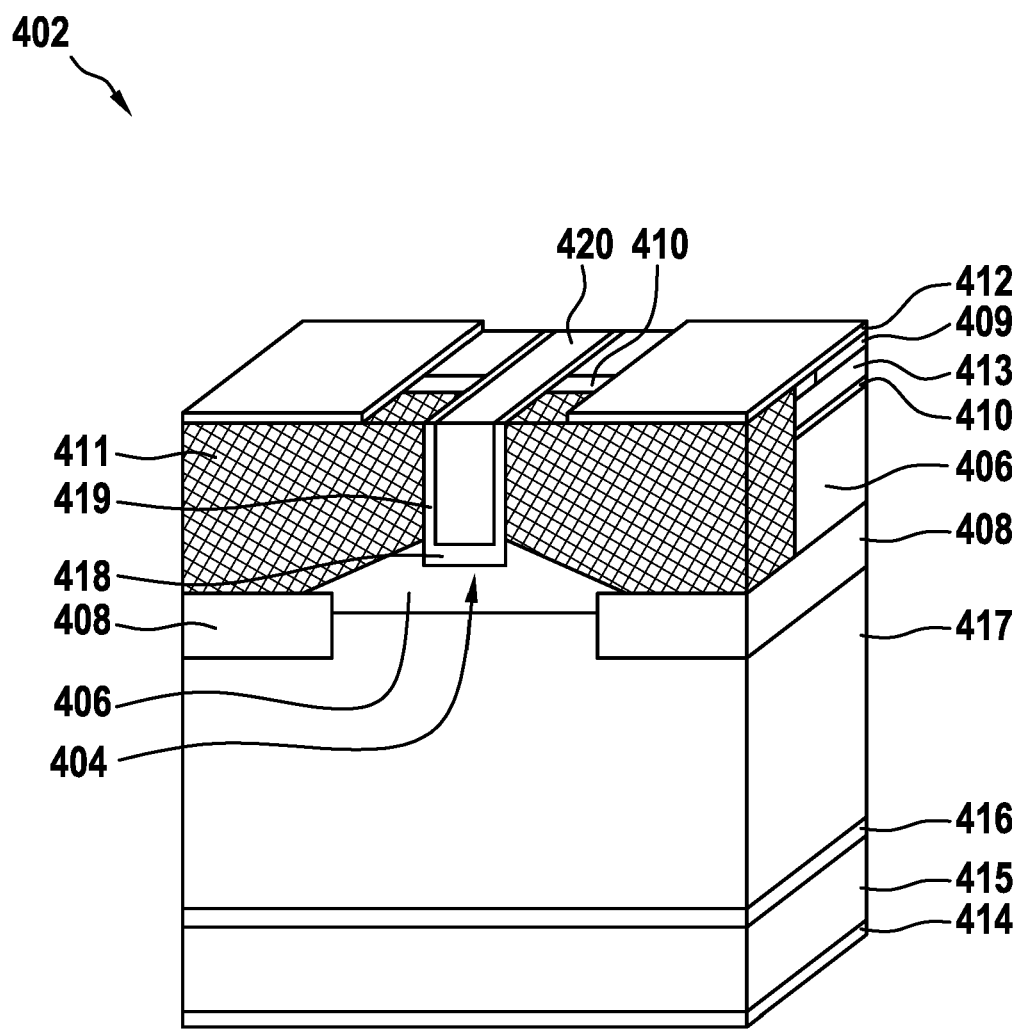
FIG. 4D shows a rear view of the further front power transistor half-cell.
Figure 4D:
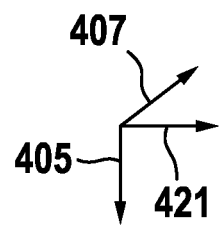

FIG. 4D shows a rear view of further front power transistor half-cell 402. The two rear locations of the reference numerals of FIG. 4D, which correspond to the identical rear reference numerals of FIG. 2D, described the same components as in FIG. 2D. FIG. 4D also shows body contacting regions 413.

Figure 5A:
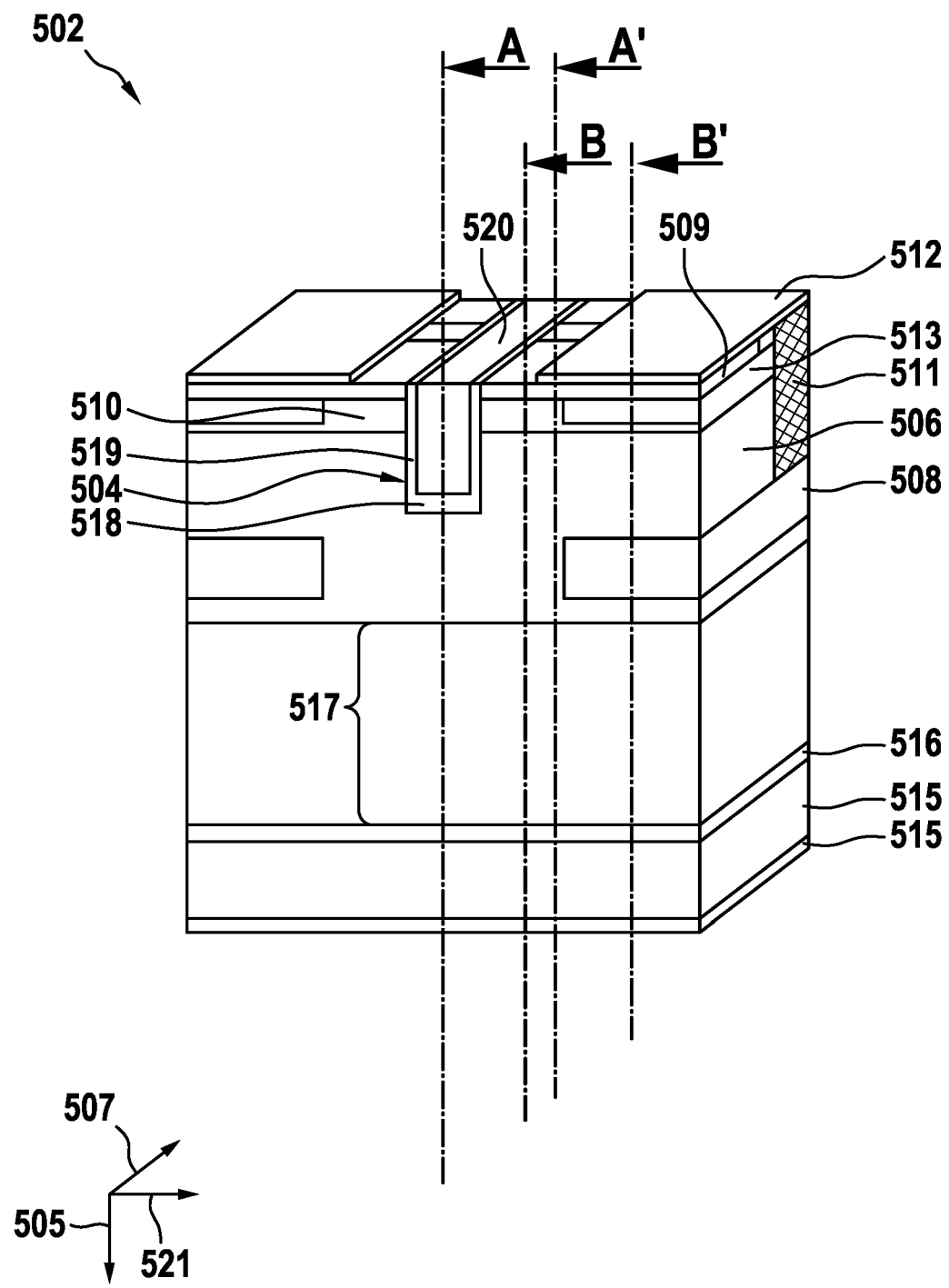
FIG. 5A shows a top view of a further front power transistor half-cell, in accordance with an example embodiment of the present invention.

FIG. 5A shows a top view of a further front power transistor cell 502. The two rear locations of the reference numerals of FIG. 5A, which correspond to the identical rear reference numerals of FIG. 4A, describe the same components as in FIG. 4A. The difference compared to FIG. 4A is that current-spreading layer 506 as viewed from the front side of layer arrangement 501 extends deeper into layer arrangement 501 than current-spreading layer 406 in FIG. 4A. In other words, trench bottom 504 and field shielding areas 508 are situated completely within current-spreading layer 506 and are spaced apart from drift layer 517. As a result, the JFET effect between adjacent field shielding areas 508 is counteracted along third direction 521, so that a lower forward resistance is generated. In addition, the corners of field shielding areas 511 may be rounded in the direction of trench 504 and of semiconductor substrate 515.

Figure 5B:
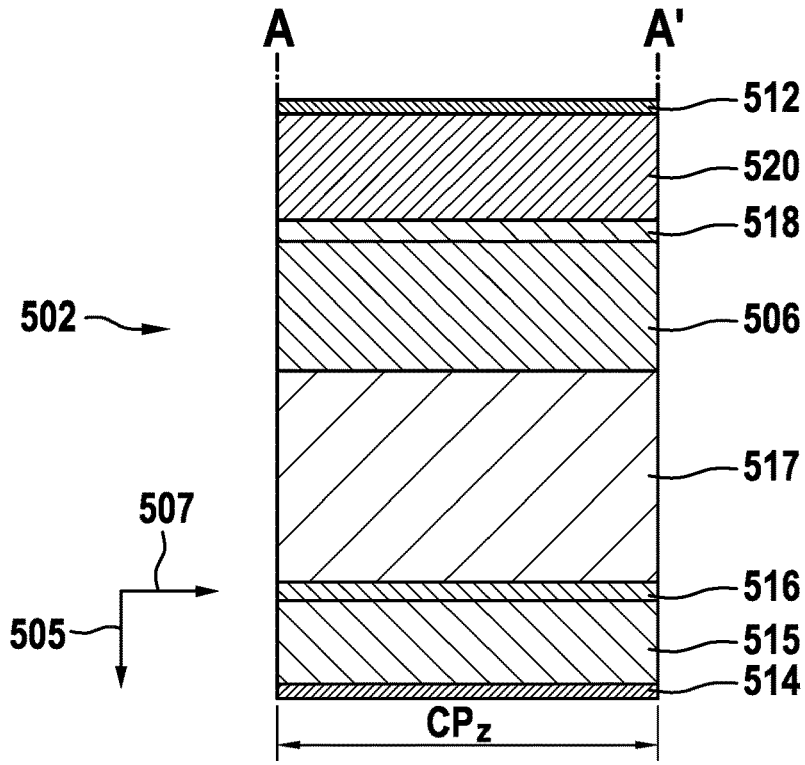
FIG. 5B shows a sectional view along plane AA' through the further front power transistor half-cell.

FIG. 5B shows a sectional view along plane AA' through further front power transistor half-cell 502. The two rear locations of the reference numerals of FIG. 5B, which correspond to the identical rear reference numerals of FIG. 4B, describe the same components as in FIG. 4B. FIG. 5B differs from FIG. 4B insofar as current-spreading layer 506 starting from the front side of layer arrangement 501 extends deeper than current-spreading layer 406 of FIG. 4B.

Figure 5C:
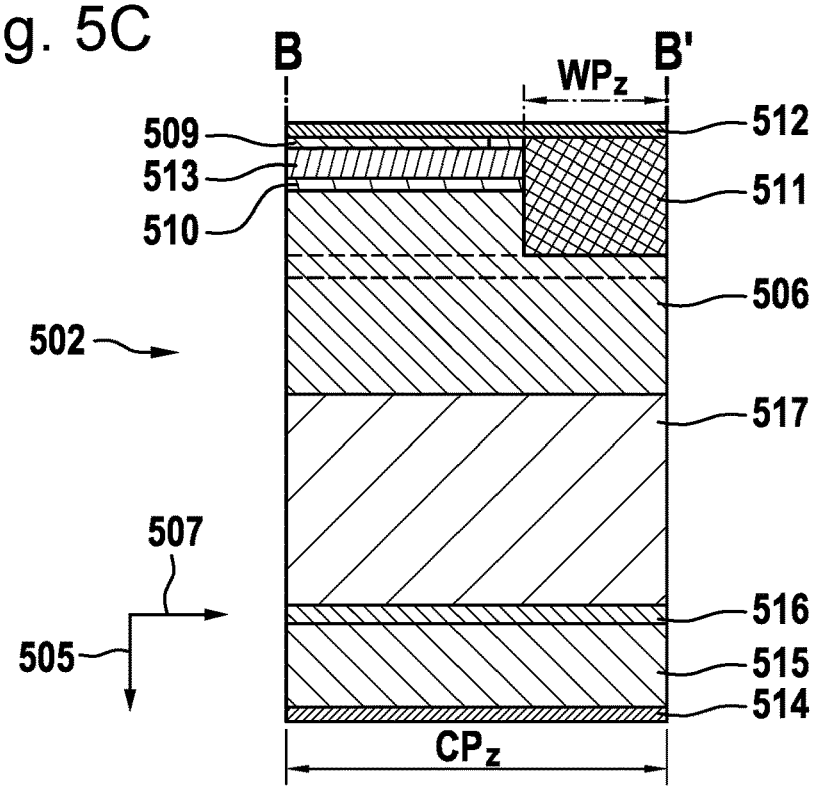
FIG. 5C shows a sectional view along plane BB' through the further front power transistor half-cell.

FIG. 5C shows a sectional view along plane BB' through further front power transistor half-cell 502. The two rear locations of the reference numerals of FIG. 5C, which correspond to the identical rear reference numerals of FIG. 4C, describe the same components as in FIG. 4C. FIG. 5C differs from FIG. 4C insofar as current-spreading layer 506 starting from the front side of layer arrangement 501 extends deeper than current-spreading layer 406 of FIG. 4C.

Figure 5D:
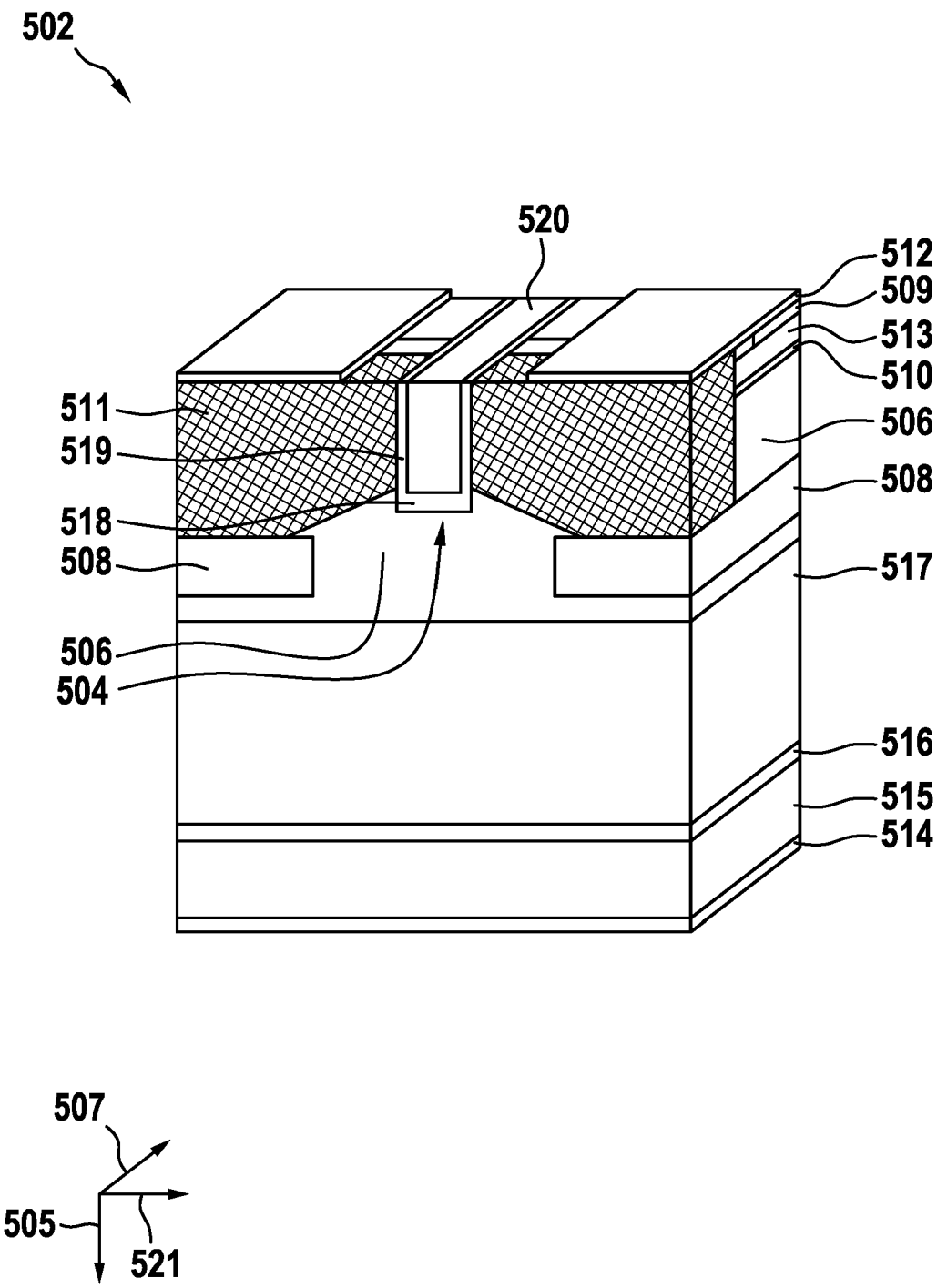
FIG. 5D shows a rear view of the further front power transistor half-cell.

FIG. 5D shows the rear view of further front power transistor half-cell 502. The two rear locations of the reference numerals of FIG. 5D, which correspond to the identical rear reference numerals of FIG. 4D, describe the same components as in FIG. 4D. Current-spreading layer 506 in this case extends starting from the front side of the layer arrangement deeper into the layer arrangement than current-spreading layer 406 from FIG. 4D.

Figure 6A:
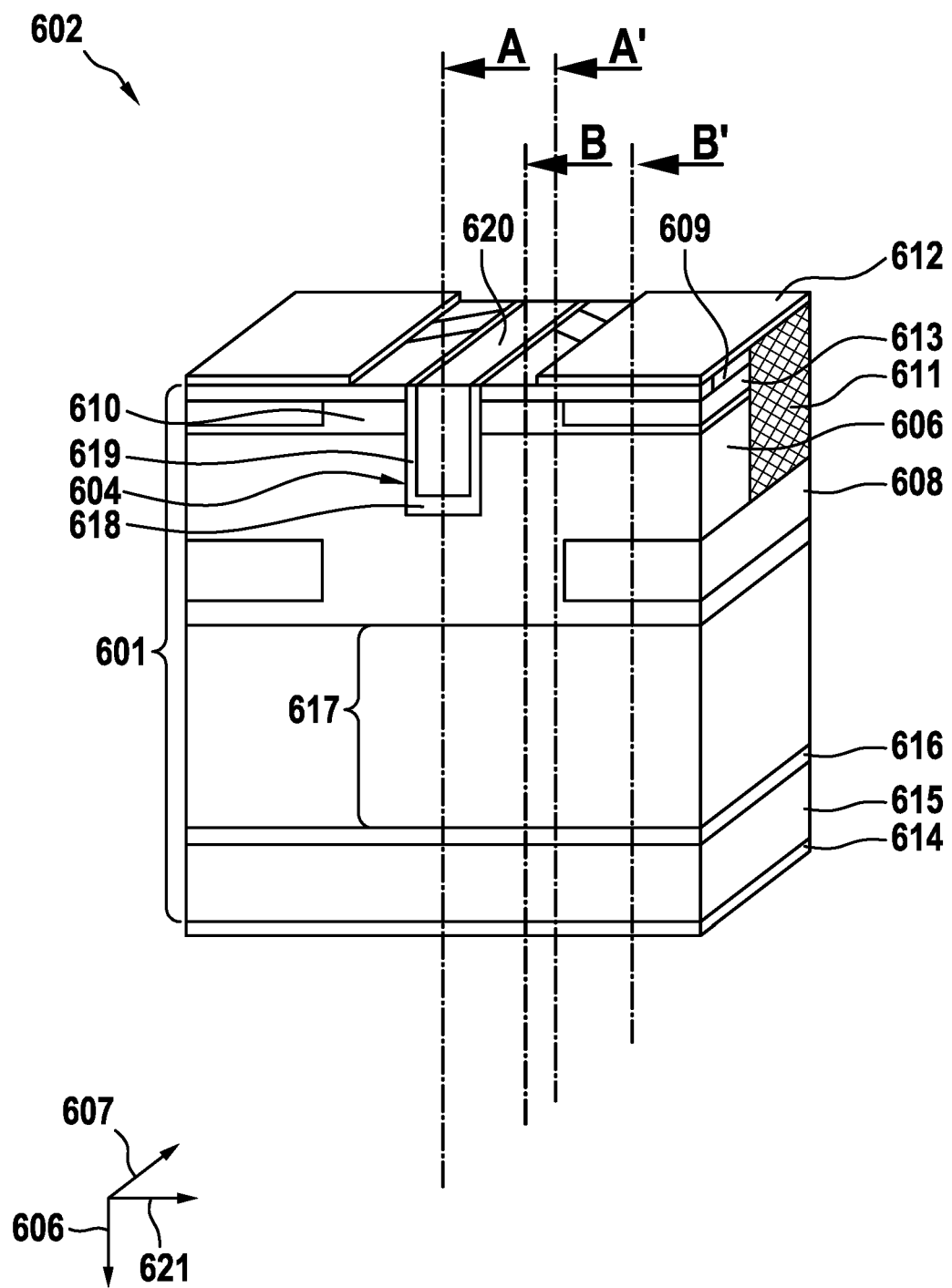
FIG. 6A shows a top view of a further front power transistor half-cell, in accordance with an example embodiment of the present invention.

FIG. 6A shows a top view of a further front power transistor cell 602. The two rear locations of the reference numerals of FIG. 6A, which correspond to the identical rear reference numerals of FIG. 5A, describe the same components as in FIG. 5A. The difference compared to FIG. 5A is that a width of source areas 609, of body areas 610 and of field shielding contacting areas 611 varies over the width of power transistor cell 600. In other words, the expansion of field shielding contacting areas 611 along second direction 607 is not constant over the width of power transistor cell 600, but maximally in the central area between the trenches, i.e., when two power transistor cells, for example, are joined together along direction 621. This means that the area of field shielding contacting area 611 making contact with the side wall of trench 604 is small. The expansion of source areas 609 behaves in the opposite manner. The expansion is minimal in the area between the central trenches and maximal along the side wall of trench 604. This means that the boundary between source areas 609 and body areas 610 extends in the shape of a triangle along the surface of the transistor cell, the base side or wider side of the triangle bordering on the side wall of trench 604. This exemplary embodiment thus combines narrow field shielding contacting areas 611 close to the trench, low forward resistances and wide field shielding contacting areas 611 above field shielding areas 608 for a good electrical connection of field shielding areas 608.

Figure 6B:
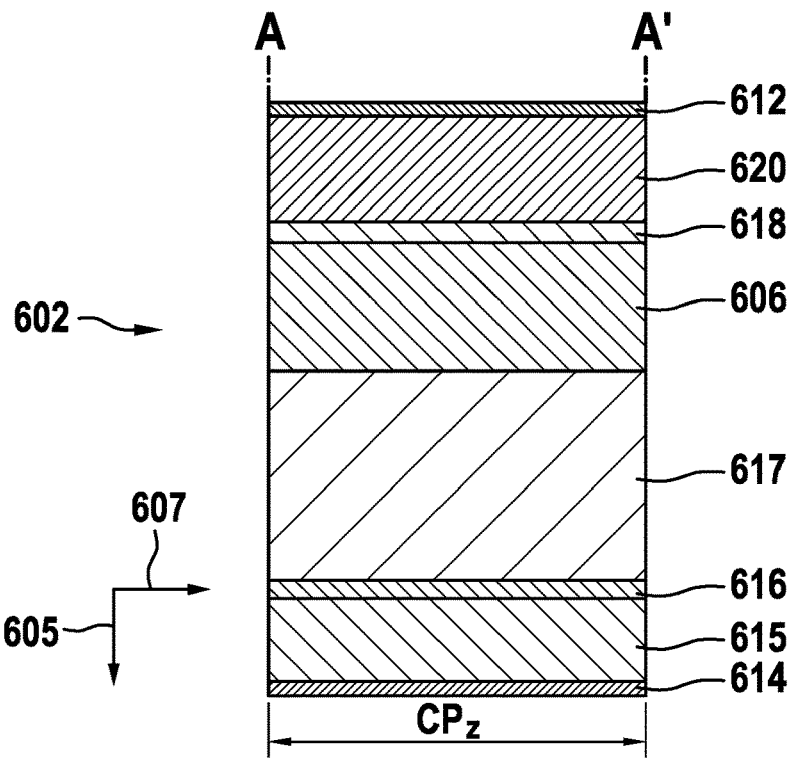
FIG. 6B shows a sectional view along plane AA' through the further front power transistor half-cell.

FIG. 6B shows a sectional view along plane AA' through further front power transistor half-cell 602. The two rear locations of the reference numerals of FIG. 6B, which correspond to the identical rear reference numerals of FIG. 5B, describe the same components as in FIG. 5B.

Figure 6C:
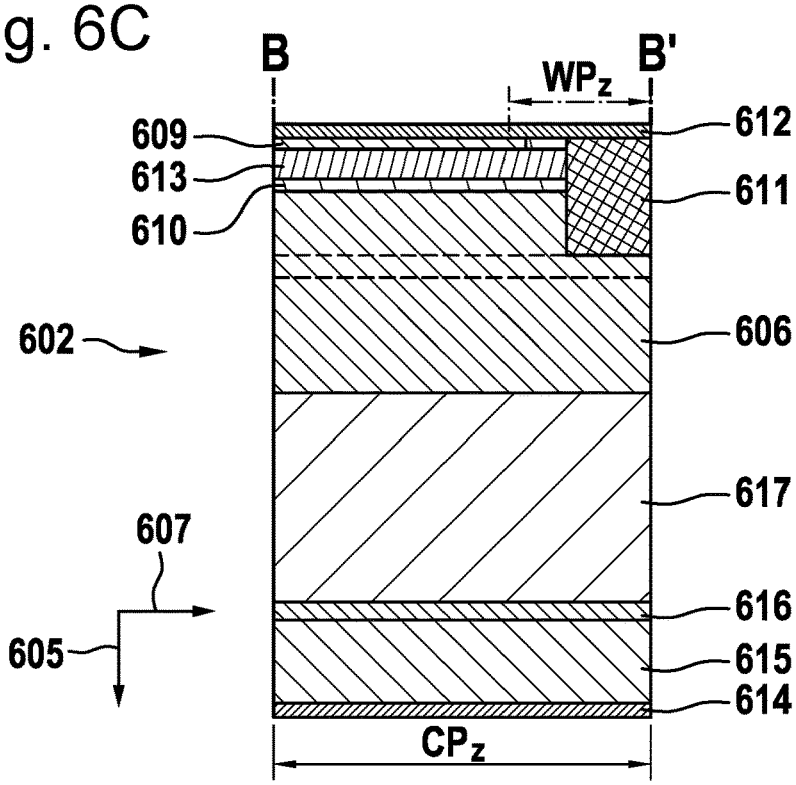
FIG. 6C shows a sectional view along plane BB' through the further front power transistor half-cell.

FIG. 6C shows a sectional view along plane BB' through further front power transistor half-cell 602. The two rear locations of the reference numerals of FIG. 6C, which correspond to the identical rear reference numerals of FIG. 5C, describe the same components as in FIG. 5C. FIG. 6C differs from FIG. 5C insofar as source areas 609, body areas 610 and field shielding areas 611 have no constant width along the width of power transistor cell 600.

Figure 6D:
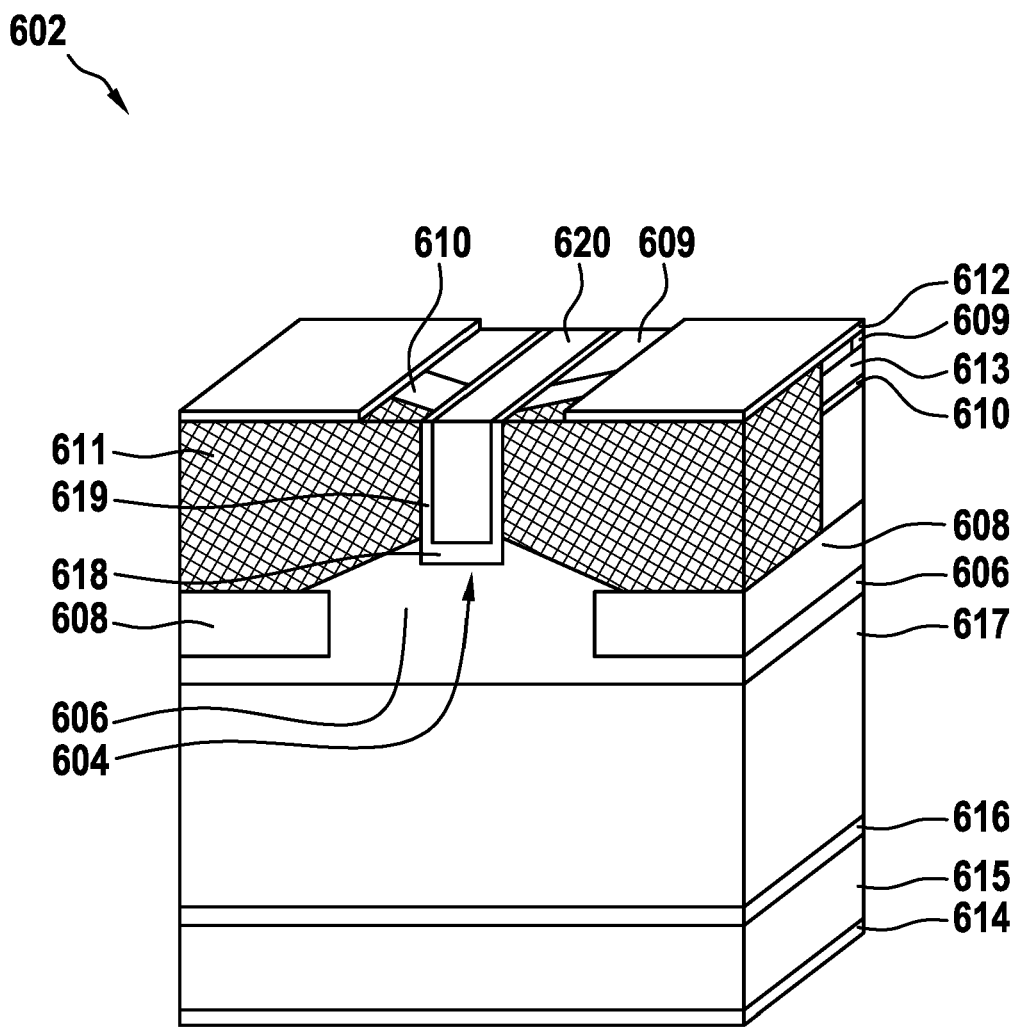
FIG. 6D shows a rear view of the further front power transistor half-cell.
Figure 6D:
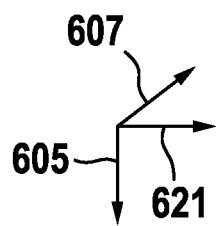

FIG. 6D shows the rear view of further front power transistor half-cell 602. The two rear locations of the reference numerals of FIG. 6D, which correspond to the identical rear reference numerals of FIG. 5D, describe the same components as in FIG. 5D. Here, too, it is apparent that the width of source areas 609, body areas 610 and field shielding areas 611 varies along the width of the power transistor cell.

Figure 7A:
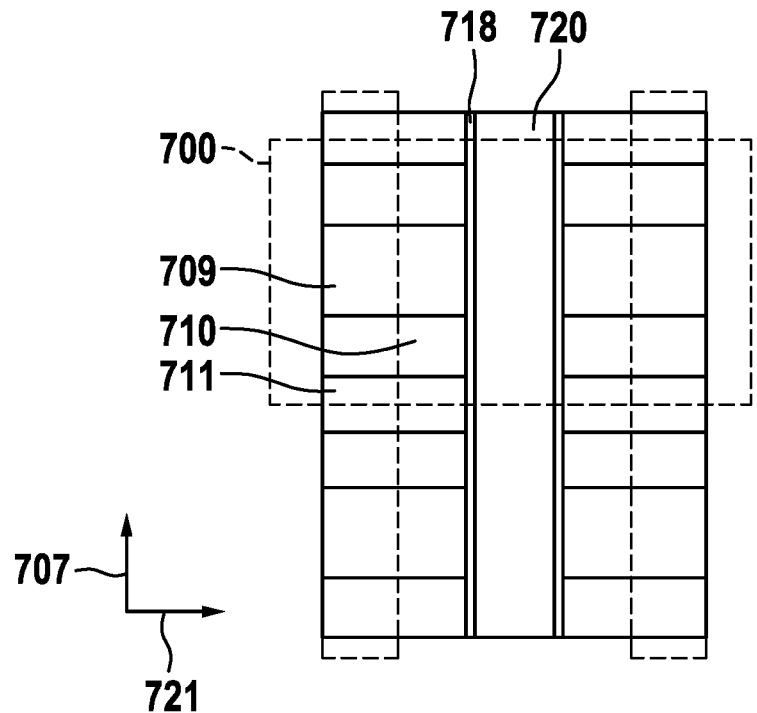
FIG. 7A shows a top view of two power transistor cells, in accordance with an example embodiment of the present invention.

FIG. 7A shows a top view of two power transistor cells 700, which are situated along second direction 707. Source areas 709, body areas 710 and field shielding contacting areas 711 are rectangular-shaped. This means, the width of source areas 709, the width of body areas 710 and the width of field shielding contacting areas 711 are identical over the width of power transistor cell 700. Source areas 709, body areas 710 and field shielding contacting areas 711 extend in each case from the side face of the trench to the power transistor cell edge.

Figure 7B:
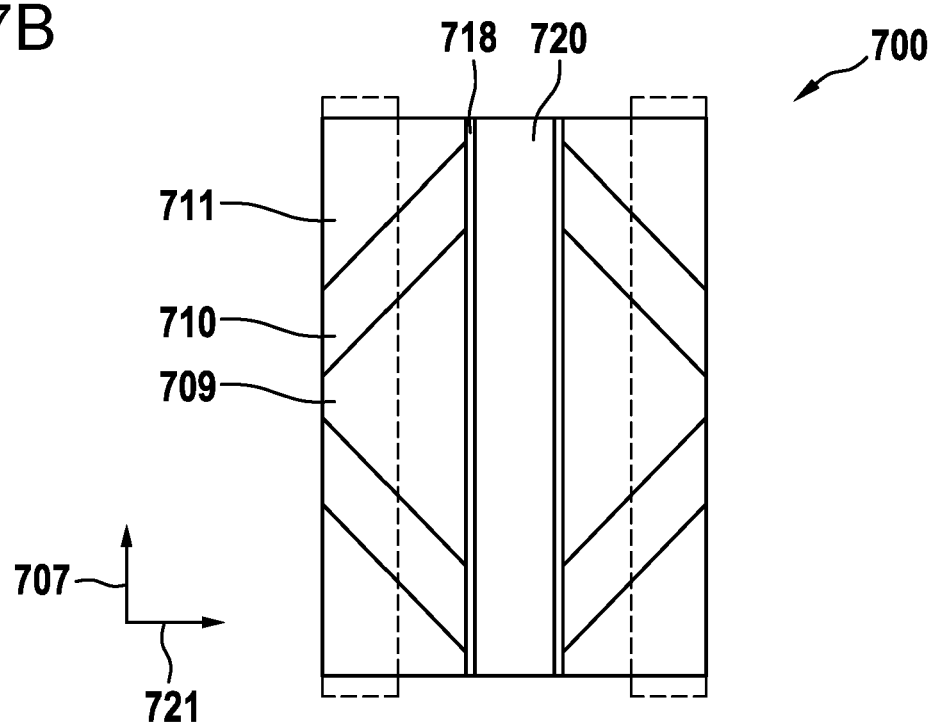
FIG. 7B shows a top view of a further power transistor cell.

FIG. 7B shows a top view of a further power transistor cell 700. Source areas 709, body areas 710 and field shielding contacting areas 711 have a different width along third direction 721.

A power transistor includes a plurality of power transistor cells 700. Power transistor cells 700 are joined together along second direction 707 and third direction 721. Identically structured power transistors are preferably joined together. Different power transistor cells may, however, also be joined together.

In one further specific embodiment, the power transistor cells in adjacent power transistor cells are interlaced, so that in one strip a field shielding contacting area is present and in the adjacent strip no field shielding contacting area or only a portion thereof is present.

Figure 8A:
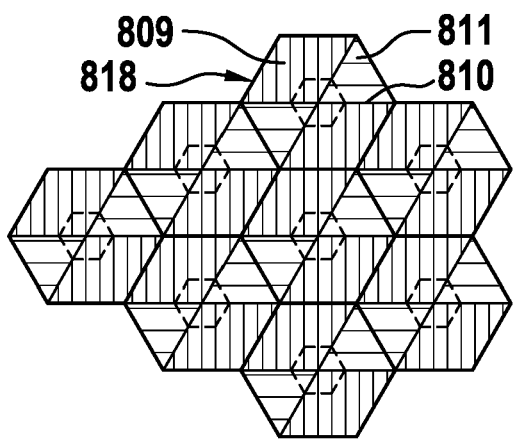
FIG. 8A shows a first hexagonal cell geometry, in accordance with an example embodiment of the present invention.
Figure 8B:
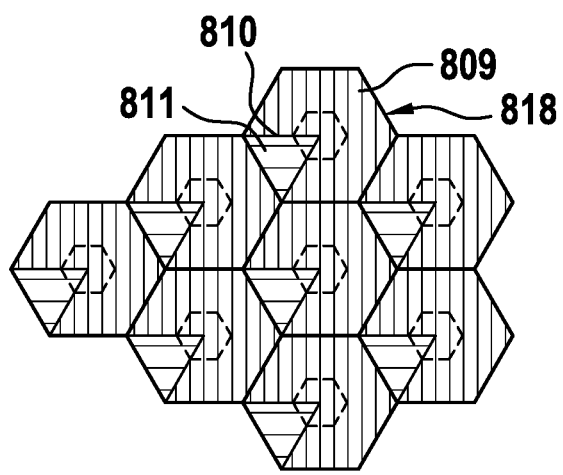
FIG. 8B shows a second hexagonal cell geometry, in accordance with an example embodiment of the present invention.
Figure 8C:
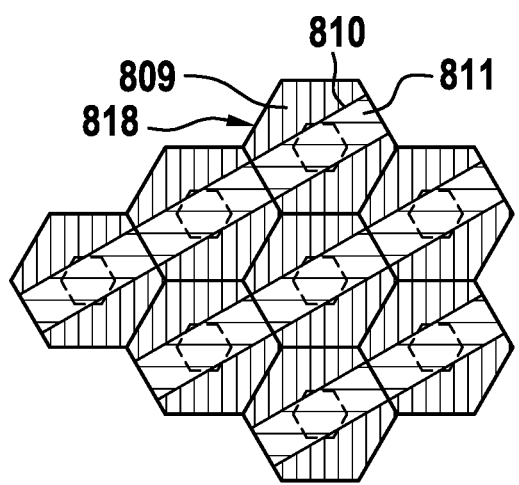
FIG. 8C shows a third hexagonal cell geometry, in accordance with an example embodiment of the present invention.
Figure 9A:
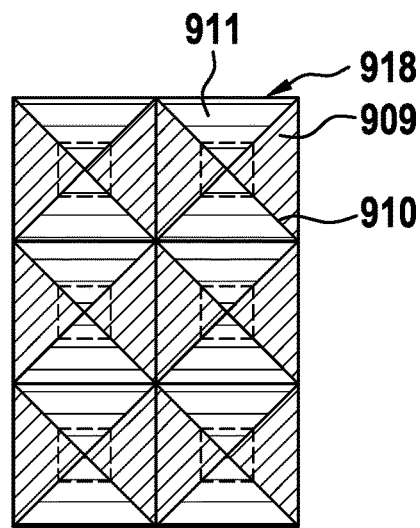
FIG. 9A shows a first square cell geometry, in accordance with an example embodiment of the present invention.
Figure 9B:
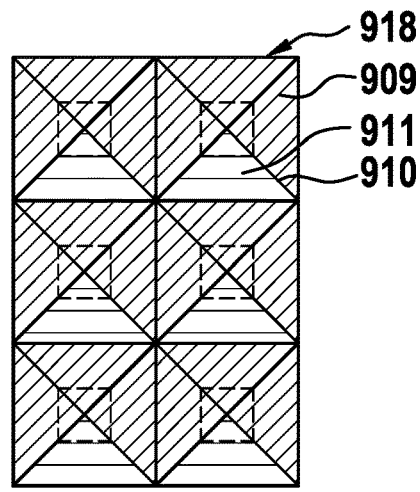
FIG. 9B shows a second square cell geometry, in accordance with an example embodiment of the present invention.
Figure 9C:
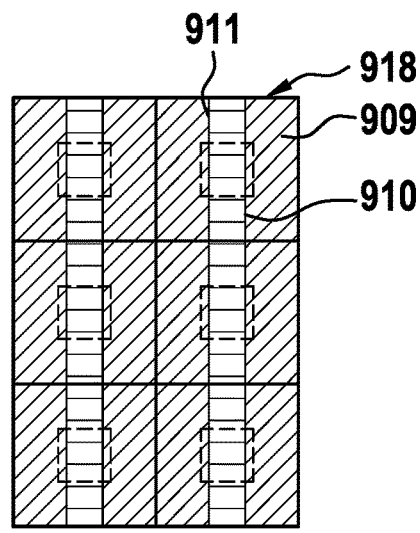
FIG. 9C shows a third square cell geometry, in accordance with an example embodiment of the present invention.

Aside from a strip-like arrangement of the power transistor cells, other cell geometries may also be implemented. FIGS. 8A, 8B, and 8C show three hexagonal and FIGS. 9A, 9B, and 9C show three square cell arrangements schematically in a top view. Source areas 809 and 909 and field shielding contacting areas 811 and 911, as well as gate oxides 819 and 919, may be seen. The source metallization is not shown. Field shielding areas 808 and 908 within the layer arrangement are represented as dashed circled regions.

Instead of an n-channel component, the dual constructed p-channel component in addition is also described by this application. In this case, all n-dopings should be exchanged with p-dopings and the signs of the voltages should be reversed.

The operating mode of the power transistor cell in the forward case and in the blocking case is described below. In the forward case, a source potential is applied at the first metal areas i.e., the source terminal. For the further embodiments, the source potential serves as a reference potential. The gate metallization has a positive gate potential and the second metal area, i.e., the drain terminal, has a small positive drain potential of a few volts. If the gate potential is below threshold voltage Vth, then only a low current flows from the drain terminal to the source terminal. If the gate voltage is increased, i.e., it has a higher value than the threshold voltage, then numerous electrons are drawn to the surface of the body areas on the gate oxide side, as a result of which a conductive channel is formed. Thus, a low-impedance current path is generated from the drain terminal through the semiconductor substrate, the buffer layer, the drift layer, the current-spreading layer, the channels formed at the surfaces of the body areas on the gate oxide side, the source areas up to the source terminal. The power transistor cell or the component including one or a plurality of power transistor cells is thus able to carry a high current density.

In the blocking case, the gate voltage has a lower value than the threshold voltage. The drain voltage has a positive voltage value. With increasing drain voltage, the space charge zones of the pn-transitions absorbing the blocking voltage between the p-doped field shielding areas, the p-doped field shielding contacting areas and the p-doped body areas, as well as the adjoining, respectively lower n-doped current-spreading layer and drift layer, expand essentially into the n-doped regions, i.e., the current-spreading layer and the drift layer. With increasing blocking voltage, the space charge zone expands into the buffer layer, the p-doped field shielding areas, the p-doped field shielding contacting areas and the p-doped body areas not being completely cleared.

A compromise may be achieved between a low forward resistance and the shielding effect regarding the ratio of the entire lateral width WP of the field shielding areas to the total lateral pitch CP of the power transistor cell. If the ratio becomes greater, then the shielding effect of the field shielding contacting areas is more effective and the forward resistance is higher. If the ratio approaches zero, then the forward resistance is very low, however, the shielding effect is also. Thus, a ratio of approximately 0.5 is preferred.

Due to internal voltage drops and to the high doping, the field shielding areas and the field shielding contacting areas function in cooperation with the adjoining drift layer and the current-spreading layer as an intrinsic diode. If the intrinsic diode is energized, then the gate voltage has a value lower than the threshold voltage and the drain voltage has a negative voltage.

A compromise may be established between low forward resistance and electrical connection of the field shielding areas regarding the ratio of the expansion of the field shielding contacting areas along the second direction to the expansion of the power transistor cell in the second direction. If the value of the ratio approaches the value 1, then the forward resistance is high, however, the electrical connection is very good. If the value of the ratio approaches the value zero, then the electrical connection is low, but the forward resistance is very low. In this case, a ratio of approximately 0.25 is preferred.

The power transistors may be applied in inverters for industrial drive systems, in inverters for regenerative power generation such as wind power plants, automotive inverters for electric vehicles and hybrid vehicles, traction drives or high-voltage rectifiers.

What is claimed is:
1. A power transistor cell, comprising:
a layer arrangement which includes a front side and a rear side, the front side being situated opposite the rear side, a trench extending starting from the front side along a first direction into the layer arrangement, and the trench extending at least into a current-spreading layer, the trench expanding along a second direction, which is situated perpendicularly to the first direction, and field shielding areas being situated at least partially in the current-spreading layer, wherein source areas and field shielding contacting areas are situated alternatingly along the second direction, one portion of each of a plurality of body areas being situated between each source area and each field shielding contacting area, the field shielding contacting areas connecting the field shielding areas to first metal areas on the front side and the field shielding contacting areas making contact at least partially with side faces of the trench.

2. The power transistor cell as recited in claim 1, wherein the field shielding areas are situated within the current-spreading layer and spaced apart from a drift layer.

3. The power transistor cell as recited in claim 1, wherein the field shielding areas are spaced further apart from the front side of the layer arrangement than a bottom of the trench.

4. The power transistor cell as recited in claim 1, wherein the current-spreading layer is bell-shaped laterally to the field shielding contacting areas.

5. The power transistor cell as recited in claim 1, wherein the current-spreading layer is rectangular-shaped laterally to the field shielding contacting areas.

6. The power transistor cell as recited in claim 1, wherein body contacting regions are situated within the body areas partially below the source areas, the body contacting regions being connected via the field shielding contacting areas to the first metal areas of the front side of the layer arrangement.

7. The power transistor cell as recited in claim 1, wherein the field shielding areas are rounded in a direction of the trench and/or of the rear side.

8. The power transistor cell as recited in claim 1, wherein the layer arrangement includes a semiconductor substrate including a wide band gap.

9. The power transistor cell as recited in claim 8, wherein the semiconductor substrate includes silicon carbide or gallium nitride.

10. A power transistor, comprising:
a plurality of power transistor cells, each of the power transistor cells including:
a layer arrangement which includes a front side and a rear side, the front side being situated opposite the rear side, a trench extending starting from the front side along a first direction into the layer arrangement, and the trench extending at least into a current-spreading layer, the trench expanding along a second direction, which is situated perpendicularly to the first direction, and field shielding areas being situated at least partially in the current-spreading layer, wherein source areas and field shielding contacting areas are situated alternatingly along the second direction, one portion of each of a plurality of body areas being situated between each source area and each field shielding contacting area, the field shielding contacting areas connecting the field shielding areas to first metal areas on the front side and the field shielding contacting areas making contact at least partially with side faces of the trench.

* * * * *